United States Patent
Burak et al.

(10) Patent No.: US 9,490,418 B2
(45) Date of Patent: Nov. 8, 2016

(54) ACOUSTIC RESONATOR COMPRISING COLLAR AND ACOUSTIC REFLECTOR WITH TEMPERATURE COMPENSATING LAYER

(71) Applicant: Avago Technologies General IP (Singapore) Pte. Ltd., Singapore (SG)

(72) Inventors: Dariusz Burak, Fort Collins, CO (US); John Choy, Westminster, CO (US); Kevin J. Grannen, Thornton, CO (US); Qiang Zou, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 414 days.

(21) Appl. No.: 14/092,077

(22) Filed: Nov. 27, 2013

(65) Prior Publication Data
US 2014/0159548 A1  Jun. 12, 2014

Related U.S. Application Data

(63) Continuation-in-part of application No. 13/767,754, filed on Feb. 14, 2013, and a continuation-in-part of application No. 13/955,774, filed on Jul. 31, 2013, now Pat. No. 9,246,473, which is a
(Continued)

(51) Int. Cl.
*H03H 9/15* (2006.01)
*H01L 41/053* (2006.01)
(Continued)

(52) U.S. Cl.
CPC ........ *H01L 41/053* (2013.01); *H03H 9/02118* (2013.01); *H03H 9/173* (2013.01)

(58) Field of Classification Search
USPC .......................... 310/311–371; 333/186–197
See application file for complete search history.

(56) References Cited

U.S. PATENT DOCUMENTS

| | | | |
|---|---|---|---|
| 4,633,285 A | 12/1986 | Hunsinger et al. | |
| 4,916,520 A | 4/1990 | Kurashima | |

(Continued)

FOREIGN PATENT DOCUMENTS

| | | |
|---|---|---|
| CN | 101170303 | 4/2008 |
| EP | 0880227 | 8/2012 |

(Continued)

OTHER PUBLICATIONS

Humberto Campanella Pineda, "Thin-film bulk acoustic wave resonators—FBAR", Bellaterra i Montpellier, Dec. 2007, pp. 1-241.
(Continued)

*Primary Examiner* — Thomas Dougherty

(57) ABSTRACT

An acoustic resonator structure includes an acoustic reflector over a cavity formed in a substrate, the acoustic reflector including a layer of low acoustic impedance material stacked on a layer of high acoustic impedance material. The acoustic resonator further includes a bottom electrode on the layer of low acoustic impedance material, a piezoelectric layer on the bottom electrode, a top electrode on the piezoelectric layer, and a collar formed outside a main membrane region defined by an overlap between the top electrode, the piezoelectric layer and the bottom electrode. The collar has an inner edge substantially aligned with a boundary of or overlapping the main membrane region. The layer of the low acoustic impedance material includes a temperature compensating material having a positive temperature coefficient for offsetting at least a portion of a negative temperature coefficient of the piezoelectric layer, the bottom electrode and the top electrode.

20 Claims, 15 Drawing Sheets

Related U.S. Application Data continuation-in-part of application No. 13/781,491, filed on Feb. 28, 2013, which is a continuation-in-part of application No. 13/663,449, filed on Oct. 29, 2012, said application No. 13/955,774 is a continuation-in-part of application No. 13/208,883, filed on Aug. 12, 2011, now Pat. No. 9,083,302, which is a continuation-in-part of application No. 13/074,262, filed on Mar. 29, 2011, now Pat. No. 9,136,818.

(51) Int. Cl.
 H03H 9/02 (2006.01)
 H03H 9/17 (2006.01)

(56) References Cited

U.S. PATENT DOCUMENTS

| | | |
|---|---|---|
| 4,933,743 A | 6/1990 | Thomas et al. |
| 5,006,478 A | 4/1991 | Kobayashi et al. |
| 5,087,959 A | 2/1992 | Omori et al. |
| 5,587,620 A | 12/1996 | Ruby et al. |
| 5,698,928 A | 12/1997 | Mang et al. |
| 5,817,446 A | 10/1998 | Lammert |
| 5,825,092 A | 10/1998 | Delgado et al. |
| 5,873,153 A | 2/1999 | Ruby et al. |
| 6,107,721 A | 8/2000 | Lakin |
| 6,230,378 B1 * | 5/2001 | Cramer ............... H01L 41/083 29/25.35 |
| 6,291,931 B1 | 9/2001 | Lakin |
| 6,384,697 B1 | 5/2002 | Ruby |
| 6,395,618 B2 | 5/2002 | Vergani et al. |
| 6,396,200 B2 | 5/2002 | Misu et al. |
| 6,424,237 B1 | 7/2002 | Ruby et al. |
| 6,476,536 B1 | 11/2002 | Pensala |
| 6,507,983 B1 | 1/2003 | Ruby et al. |
| 6,548,943 B2 | 4/2003 | Kaitila et al. |
| 6,607,934 B2 | 8/2003 | Chang et al. |
| 6,617,751 B2 | 9/2003 | Sunwoo et al. |
| 6,709,776 B2 | 3/2004 | Noguchi et al. |
| 6,767,757 B2 | 7/2004 | Kang et al. |
| 6,864,619 B2 | 3/2005 | Aigner et al. |
| 6,927,649 B2 | 8/2005 | Metzger et al. |
| 6,936,837 B2 | 8/2005 | Yamada et al. |
| 6,985,051 B2 | 1/2006 | Nguyen et al. |
| 6,987,433 B2 | 1/2006 | Larson et al. |
| 7,019,605 B2 | 3/2006 | Larson et al. |
| 7,084,553 B2 | 8/2006 | Ludwiczak |
| 7,091,649 B2 | 8/2006 | Larson et al. |
| 7,123,119 B2 | 10/2006 | Pashby et al. |
| 7,161,447 B2 | 1/2007 | Nomura et al. |
| 7,161,448 B2 | 1/2007 | Feng et al. |
| 7,173,504 B2 | 2/2007 | Larson et al. |
| 7,199,683 B2 | 4/2007 | Thalhammer |
| 7,230,509 B2 | 6/2007 | Stoemmer et al. |
| 7,230,511 B2 | 6/2007 | Onishi |
| 7,233,218 B2 | 6/2007 | Park et al. |
| 7,242,270 B2 | 7/2007 | Larson et al. |
| 7,275,292 B2 | 10/2007 | Ruby et al. |
| 7,280,007 B2 | 10/2007 | Feng et al. |
| 7,295,088 B2 | 11/2007 | Nguyen et al. |
| 7,310,874 B2 | 12/2007 | Higuchi et al. |
| 7,332,985 B2 | 2/2008 | Larson et al. |
| 7,345,410 B2 | 3/2008 | Grannen et al. |
| 7,353,707 B2 | 4/2008 | Mikado et al. |
| 7,358,831 B2 | 4/2008 | Larson, III et al. |
| 7,362,198 B2 | 4/2008 | Larson et al. |
| 7,365,619 B2 | 4/2008 | Aigner et al. |
| 7,367,095 B2 | 5/2008 | Larson et al. |
| 7,377,168 B2 | 5/2008 | Liu |
| 7,385,835 B2 | 6/2008 | Leedy |
| 7,388,454 B2 | 6/2008 | Ruby et al. |
| 7,388,455 B2 | 6/2008 | Larson et al. |
| 7,391,285 B2 | 6/2008 | Larson et al. |
| 7,391,286 B2 | 6/2008 | Jamneala et al. |
| 7,400,217 B2 | 7/2008 | Larson et al. |
| 7,408,428 B2 | 8/2008 | Larson et al. |
| 7,423,503 B2 | 9/2008 | Larson et al. |
| 7,425,787 B2 | 9/2008 | Larson et al. |
| 7,427,819 B2 | 9/2008 | Hoen et al. |
| 7,435,613 B2 | 10/2008 | Barber |
| 7,456,497 B2 | 11/2008 | Higashi |
| 7,459,990 B2 | 12/2008 | Wunnicke et al. |
| 7,466,213 B2 | 12/2008 | Lobl et al. |
| 7,468,608 B2 | 12/2008 | Feucht et al. |
| 7,485,213 B2 | 1/2009 | Yu et al. |
| 7,491,569 B2 | 2/2009 | Fattinger |
| 7,514,844 B2 | 4/2009 | Unkrich et al. |
| 7,515,018 B2 | 4/2009 | Handtmann et al. |
| 7,525,398 B2 | 4/2009 | Nishimura |
| 7,535,154 B2 | 5/2009 | Umeda |
| 7,554,166 B2 | 6/2009 | Wei et al. |
| 7,562,429 B2 | 7/2009 | Larson et al. |
| 7,586,392 B2 | 9/2009 | Unkrich et al. |
| 7,600,371 B2 | 10/2009 | Stemberger et al. |
| 7,612,636 B2 | 11/2009 | Jamneala et al. |
| 7,616,079 B2 | 11/2009 | Tikka et al. |
| 7,629,865 B2 | 12/2009 | Ruby |
| 7,636,026 B2 | 12/2009 | Heinze et al. |
| 7,642,693 B2 | 1/2010 | Akiyama et al. |
| 7,657,983 B2 | 2/2010 | Aigner |
| 7,675,390 B2 | 3/2010 | Larson et al. |
| 7,758,979 B2 | 7/2010 | Akiyama et al. |
| 7,791,434 B2 | 9/2010 | Fazzio et al. |
| 7,795,781 B2 | 9/2010 | Barber et al. |
| 7,825,747 B2 | 11/2010 | Fattinger et al. |
| 7,825,749 B2 | 11/2010 | Thalhammer et al. |
| 7,889,024 B2 | 2/2011 | Bradley et al. |
| 7,965,019 B2 | 6/2011 | Gabl et al. |
| 7,966,722 B2 | 6/2011 | Hart et al. |
| 7,986,075 B2 | 7/2011 | Asai et al. |
| 7,986,198 B2 | 7/2011 | Nakatsuka et al. |
| 8,003,520 B2 | 8/2011 | Bonilla et al. |
| 8,008,993 B2 | 8/2011 | Milsom et al. |
| 8,018,303 B2 | 9/2011 | Handtmann et al. |
| 8,030,823 B2 * | 10/2011 | Sinha ............... H03H 9/02086 310/320 |
| 8,084,794 B2 | 12/2011 | Kamada |
| 8,120,066 B2 | 2/2012 | Lanzieri et al. |
| 8,222,795 B2 | 7/2012 | Sinha et al. |
| 8,253,513 B2 | 8/2012 | Zhang |
| 8,258,894 B2 | 9/2012 | Thalhammer et al. |
| 8,283,835 B2 | 10/2012 | Metzger et al. |
| 8,330,325 B1 | 12/2012 | Burak et al. |
| 8,384,497 B2 | 2/2013 | Zhang |
| 8,507,919 B2 | 8/2013 | Ishikura |
| 8,575,820 B2 | 11/2013 | Shirakawa et al. |
| 8,610,516 B2 | 12/2013 | Umeda et al. |
| 8,642,485 B2 | 2/2014 | Lin et al. |
| 8,718,112 B2 | 5/2014 | Mahrt |
| 8,735,911 B2 | 5/2014 | Sakai |
| 8,896,395 B2 | 11/2014 | Burak et al. |
| 9,041,128 B2 | 5/2015 | Dunbar |
| 9,083,302 B2 | 7/2015 | Burak et al. |
| 9,223,248 B2 | 12/2015 | Kawano et al. |
| 2001/0026951 A1 | 10/2001 | Vergani et al. |
| 2002/0153965 A1 | 10/2002 | Ruby et al. |
| 2003/0132493 A1 | 7/2003 | Kang et al. |
| 2003/0227357 A1 | 12/2003 | Metzger et al. |
| 2004/0046622 A1 | 3/2004 | Aigner et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |

(56) References Cited

U.S. PATENT DOCUMENTS

| | | |
|---|---|---|
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0082626 A1 | 4/2005 | Leedy |
| 2005/0093396 A1 | 5/2005 | Larson et al. |
| 2005/0093653 A1 | 5/2005 | Larson |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson et al. |
| 2005/0110598 A1 | 5/2005 | Larson |
| 2005/0128030 A1 | 6/2005 | Larson et al. |
| 2005/0140466 A1 | 6/2005 | Larson et al. |
| 2005/0151600 A1* | 7/2005 | Takeuchi ............ H03H 9/0095 333/191 |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0275486 A1 | 12/2005 | Feng et al. |
| 2006/0081048 A1 | 4/2006 | Mikado et al. |
| 2006/0087199 A1 | 4/2006 | Larson et al. |
| 2006/0103492 A1 | 5/2006 | Feng et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0132262 A1 | 6/2006 | Fazzio et al. |
| 2006/0160353 A1 | 7/2006 | Gueneau de Mussy et al. |
| 2006/0164183 A1 | 7/2006 | Tikka et al. |
| 2006/0185139 A1 | 8/2006 | Larson et al. |
| 2006/0197411 A1 | 9/2006 | Hoen et al. |
| 2006/0238070 A1 | 10/2006 | Costa et al. |
| 2006/0284707 A1 | 12/2006 | Larson et al. |
| 2006/0290446 A1 | 12/2006 | Aigner et al. |
| 2007/0035364 A1 | 2/2007 | Sridhar et al. |
| 2007/0080759 A1 | 4/2007 | Jamneala et al. |
| 2007/0084964 A1 | 4/2007 | Sternberger |
| 2007/0085213 A1 | 4/2007 | Ahn et al. |
| 2007/0085447 A1 | 4/2007 | Larson et al. |
| 2007/0085631 A1 | 4/2007 | Larson et al. |
| 2007/0085632 A1 | 4/2007 | Larson et al. |
| 2007/0086274 A1 | 4/2007 | Nishimura et al. |
| 2007/0090892 A1 | 4/2007 | Larson et al. |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2008/0055020 A1 | 3/2008 | Handtmann et al. |
| 2008/0129414 A1 | 6/2008 | Lobl et al. |
| 2008/0179995 A1 | 7/2008 | Umeda |
| 2008/0258842 A1 | 10/2008 | Ruby et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0096550 A1 | 4/2009 | Handtmann et al. |
| 2009/0102319 A1 | 4/2009 | Nakatsuka et al. |
| 2009/0127978 A1 | 5/2009 | Asai et al. |
| 2009/0267457 A1 | 10/2009 | Barber et al. |
| 2010/0013573 A1 | 1/2010 | Umeda |
| 2010/0033063 A1 | 2/2010 | Nishihara et al. |
| 2010/0039000 A1 | 2/2010 | Milson et al. |
| 2010/0052176 A1 | 3/2010 | Kamada et al. |
| 2010/0091370 A1 | 4/2010 | Mahrt et al. |
| 2010/0102358 A1 | 4/2010 | Lanzieri et al. |
| 2010/0107389 A1 | 5/2010 | Nessler et al. |
| 2010/0134209 A1 | 6/2010 | Gabl |
| 2010/0148637 A1 | 6/2010 | Satou |
| 2010/0187948 A1 | 7/2010 | Sinha et al. |
| 2010/0327697 A1 | 12/2010 | Choy et al. |
| 2010/0327994 A1 | 12/2010 | Choy et al. |
| 2011/0084779 A1 | 4/2011 | Zhang |
| 2011/0092067 A1 | 4/2011 | Bonilla et al. |
| 2011/0121916 A1 | 5/2011 | Barber et al. |
| 2011/0180391 A1 | 7/2011 | Larson et al. |
| 2011/0204996 A1 | 8/2011 | Gilbert et al. |
| 2011/0227671 A1 | 9/2011 | Zhang |
| 2011/0266917 A1 | 11/2011 | Metzger et al. |
| 2011/0266925 A1 | 11/2011 | Ruby et al. |
| 2012/0177816 A1 | 7/2012 | Larson et al. |
| 2012/0218055 A1 | 8/2012 | Burak et al. |
| 2012/0218056 A1 | 8/2012 | Burak |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0248941 A1 | 10/2012 | Shirakawa et al. |
| 2012/0280767 A1 | 11/2012 | Burak et al. |
| 2013/0003377 A1 | 1/2013 | Sakai et al. |
| 2013/0038408 A1 | 2/2013 | Burak et al. |
| 2013/0082799 A1 | 4/2013 | Zuo et al. |
| 2013/0106534 A1 | 5/2013 | Burak et al. |
| 2013/0127300 A1 | 5/2013 | Umeda et al. |
| 2013/0155574 A1 | 8/2013 | Doolittle |
| 2013/0205586 A1 | 8/2013 | Takada et al. |
| 2013/0221454 A1 | 8/2013 | Dunbar et al. |
| 2013/0235001 A1 | 9/2013 | Yun et al. |
| 2013/0241673 A1 | 9/2013 | Yokoyama et al. |
| 2013/0314177 A1 | 11/2013 | Burak et al. |
| 2013/0334625 A1 | 12/2013 | Lin |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118091 A1 | 5/2014 | Burak et al. |
| 2014/0118092 A1 | 5/2014 | Burak et al. |
| 2014/0159548 A1 | 6/2014 | Burak et al. |
| 2014/0224941 A1 | 8/2014 | Gitter |
| 2014/0225682 A1 | 8/2014 | Burak |

FOREIGN PATENT DOCUMENTS

| | | | |
|---|---|---|---|
| JP | 10173479 | 6/1998 | |
| JP | 2003017964 | 1/2003 | |
| JP | 2006186412 | 7/2006 | |
| JP | 2007-208845 A | 8/2007 | |
| JP | 2008-211394 A * | 9/2008 | ............... H03H 9/54 |
| JP | 2008-211394 A | 9/2008 | |
| JP | 4471443 | 6/2010 | |
| KR | 20020050729 | 6/2002 | |
| KR | 1020030048917 | 6/2003 | |
| WO | 9937023 | 7/1999 | |
| WO | 2005043752 | 5/2005 | |
| WO | 2006079353 | 8/2006 | |
| WO | WO-2007085332 | 8/2007 | |
| WO | 2013065488 | 5/2013 | |

OTHER PUBLICATIONS

Ranjan et al. "Strained Hexagonal ScN: A Material with Unusual Structural and Optical Properties," Physical Review Letters, Jun. 27, 2003, vol. 90, No. 25, The American Physical Society, USA.

Farrer et al., "Properties of hexagonal ScN versus wurtzite GaN and InN," Physical Review B, 2002 Nov. 20, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al, "Enhancement of piezoelectric response in scandium aluminum nitride alloy thin films prepared by dual reactive cosputtering," Advanced Materials, 2009, vol. 21, pp. 593-596, Japan.

Suzuki et al, "Influence of shadowing effect on shear mode acoustic properties in the c-axis tilted AIN films," IEEE Ultrasonics Symposium (IUS), 2010, pp. 1478-1481.

Yanagitani et al., "Giant shear mode electromechanical coupling coefficient k12 in c-axis tilted ScAIN films," IEEE Ultrasonics Symposium (IUS), 2010.

(56) References Cited

OTHER PUBLICATIONS

Kano, et al., "Enhancement of Piezoelectric Response in Scandium Aluminum Nitride Alloy Thin Films Prepared by Dual Reactive Co-Sputtering", vol. 17, 2012.
Moriera, et al., "Aluminum Scandium Nitride Thin-Film Bulk Acoustic Resonators for Wide Band Applications", Vacuum 86 (2011) 23-26.
Tang, et al. "Micromachined Bulk Acoustic Resonator with a Raised Frame", 16th International Conference on Mechatronics Technology, Oct. 16-19, 2012, Tianjin, China.
Pensala, "Thin Film Bulk Acoustic Wave Devices", Dissertation, VTT Publications 756.
Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Co-pending U.S. Appl. No. 13/781,491, filed Feb. 28, 2013.
Co-pending U.S. Appl. No. 13/955,774, filed Jul. 31, 2013.
Co-pending U.S. Appl. No. 13/766,993, filed Feb. 14, 2013.
Co-pending U.S. Appl. No. 13/662,425, filed Oct. 27, 2012.
Co-pending U.S. Appl. No. 13/662,460, filed Oct. 27, 2012.
Co-pending U.S. Appl. No. 13/767,754, filed Feb. 14, 2013.
"IEEE Xplore Abstract for Suppression of Acoustic Energy Leakage in FBARS with AI Bottom Electrode: FEM Simulation and Experimental Results", Oct. 28-31, 2007, 2 pages.
"Machine Translation of JP 2007-208845", Aug. 16, 2007, 1-9.
"Machine Translation of JP 2008-211394", Sep. 11, 2008, 1-8.
Ohara, et al., "Suppression of Acoustic Energy Leakage in FBARs with AI Bottom Electrode: FEM Simulation and Experimental Results", 2007 IEEE Ultrasonics Symposium, Oct. 28-31, 2007, 1657-1660.
"U.S. Appl. No. 13/232,334, filed Sep. 14, 2011".
"U.S. Appl. No. 13/660,941, filed Oct. 25, 2012".
"Co-pending U.S. Appl. No. 13, filed Oct. 18, 2012".
"Co-pending U.S. Appl. No. 13/036,489, filed Feb. 28, 2011".
"Co-pending U.S. Appl. No. 13/074,094, filed Mar. 29, 2011".
"Co-pending U.S. Appl. No. 13/074,262, filed Mar. 29, 2011".
"Co-pending U.S. Appl. No. 13/101,376, filed May 5, 2011".
"Co-pending U.S. Appl. No. 13/161,946, filed Jun. 16, 2011".
"Co-pending U.S. Appl. No. 13/286,038, filed Oct. 31, 2011".
"Co-pending U.S. Appl. No. 13/658,024, filed Oct. 23, 2012".
"Co-pending U.S. Appl. No. 13/660,941, filed Oct. 25, 2012".
"Co-pending U.S. Appl. No. 13/663,449, filed Oct. 29, 2012".
"Co-pending U.S. Appl. No. 13/767,765, filed Feb. 14, 2013".
"Co-pending U.S. Appl. No. 13/955,774, filed Jul. 31, 2013".
"Co-pending U.S. Appl. No. 14/092,077, filed Nov. 27, 2013".
Archibald, G. W. , "Experimental Results of Bulk Acoustic Wave Transverse Graded Electrode Patterns", *Proceedings of the 1998 IEEE International Frequency Control Symposium* 1998 , 477-483.

Kerherve, "BAW Technologies for Radiofrequency Filters and Duplexers", Nov. 2011.
Lee, et al., "Development of High-Auality FBAR Devices for Wireless Applications Employing Two-Step Annealing Treatments", *IEEE Microwave and Wireless Components Letters*, vol. 21, No. 11 Nov. 2011.
Lin, , "Temperature Compensation of Aluminum Nitride Lamb Wave Resonators Utilizing the Lowest-Order Symmetric Mode", *Electrical Engineering and Computer Sciences University of California at Berkeley* Dec. 14, 2012.
Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007 , 880-885.
Pineda, Humberto , "Thin-Film Bulk Acoustic Wave Resonators—FBAR", Bellaterra, Monpelier Dec. 2007 , 1-241.
Tas, et al., "Reducing Anchor Loss in Micromechanical Extensional Mode Resonators", *IEEE Transactions on Ultrasonics, Ferroelectrics and Frequency Control*, vol. 57, No. 2, Feb. 2010, 448-454.
Umeda, Keiichi et al., "Piezoelectric Properties of Scain Thin Films for Piezo-Mems Devices", *MEMS*, 2013, Taipei, Taiwan, Jan. 20-24, 2013 pp. 733-736 2013.
English language machine translation of JP2006186412, published Jul. 13, 2006.
English language machine translation of JP2003017964, published Jan. 17, 2003.
English language machine translation of CN101170303, published Apr. 30, 2008.
English language machine translation of JP10173479, published Jun. 26, 1998.
English language machine translation of KR1020030048917 published Jun. 25, 2003.
English language machine translation of KR20020050729, published Jun. 27, 2002.
English language machine translation of WO9937023, published Jul. 22, 1999.
Office Action mailed Jan. 28, 2015 in U.S. Appl. No. 13/658,024.
A.C. Lynch, "Precise Measurements on dielectric and magnetic materials", IEEE Transactions on Instrumentation and Measurement, vol. IM-23, No. 4, Dec. 1974, p. 425-431.
Office Action mailed Mar. 6, 2015 in U.S. Appl. No. 13/781,491.
Aigner, "SAW, BAW and the Future of Wireless", May 6, 2013, p. 1-4.
El Hassan, et al., "Techniques for Tuning BAW-SMR Resonators for the 4th Generation of Mobile Communications", Intech 2013, p. 421-442.
Office Action mailed Mar. 4, 2015 in U.S. Appl. No. 13/663,449.

\* cited by examiner

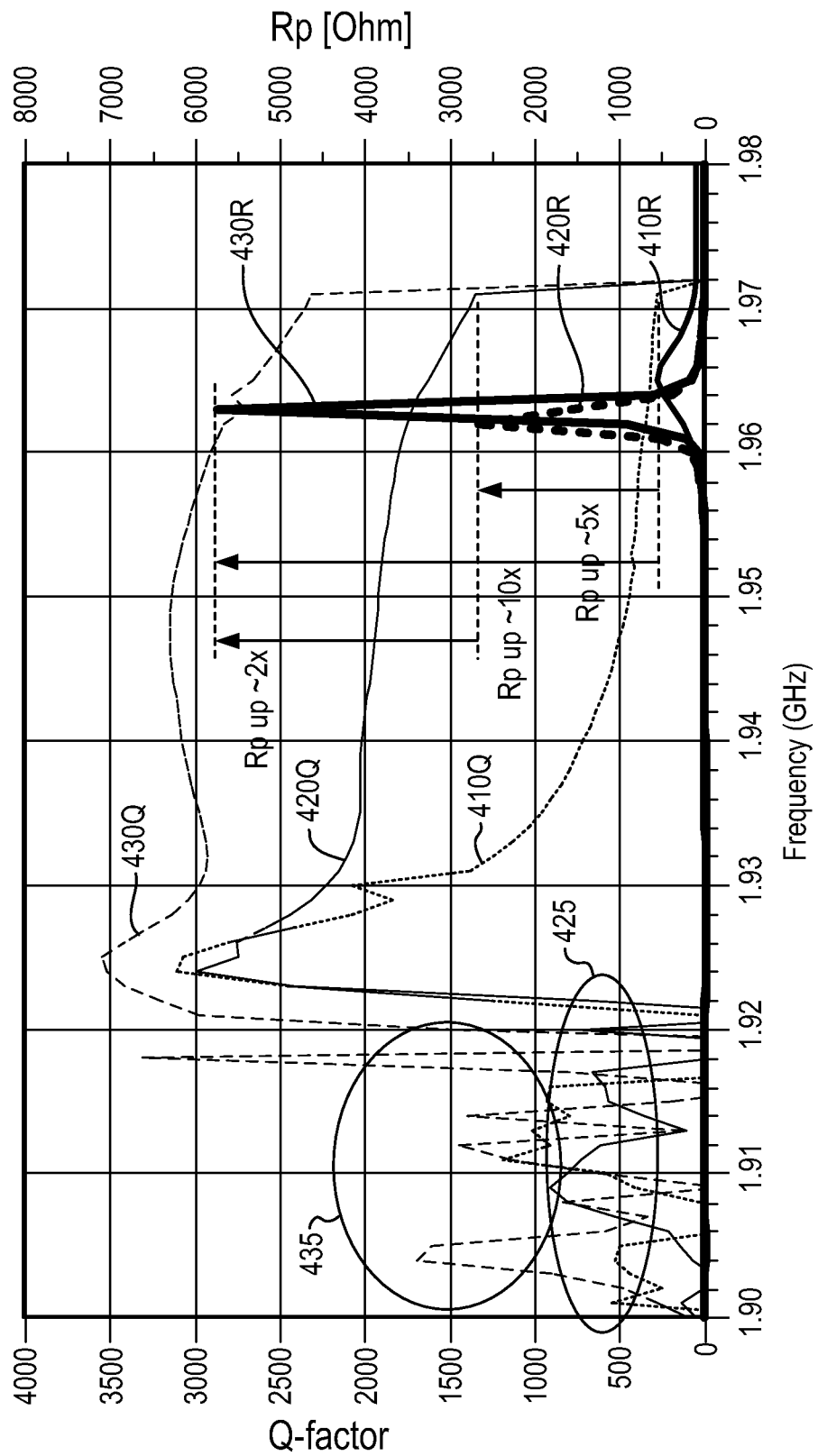

ACOUSTIC RESONATOR COMPRISING COLLAR AND ACOUSTIC REFLECTOR WITH TEMPERATURE COMPENSATING LAYER

CROSS REFERENCE TO RELATED APPLICATIONS

This application is a continuation-in-part under 37 C.F.R. §1.53(b) of commonly owned U.S. patent application Ser. No. 13/767,754 entitled "Acoustic Resonator Having Temperature Compensation," filed on Feb. 14, 2013, which is hereby incorporated by reference in its entirety. This application is also a continuation-in-part under 37 C.F.R. §1.53 (b) of commonly owned U.S. patent application Ser. No. 13/955,774 entitled "Acoustic Resonator Comprising Collar, Frame and Perimeter Distributed Bragg Reflector," filed on Jul. 31, 2013, which is a continuation-in-part of commonly owned U.S. patent application Ser. No. 13/781,491 entitled "Acoustic Resonator Having Collar and Frame," filed on Feb. 28, 2013, which is a continuation-in-part of commonly owned U.S. patent application Ser. No. 13/663, 449 entitled "Acoustic Resonator Having Collar Structure," filed on Oct. 29, 2012, which are hereby incorporated by reference in their entireties. U.S. patent application Ser. No. 13/955,774 is also a continuation-in-part under 37 C.F.R. §1.53(b) of commonly owned U.S. patent application Ser. No. 13/208,883 entitled "Stacked Bulk Acoustic Resonator Comprising a Bridge and an Acoustic Reflector along a Perimeter of the Resonator," filed on Aug. 12, 2011 (published as U.S. Patent App. Pub. No. 2012/0218059), which is a continuation-in-part application of commonly owned U.S. patent application Ser. No. 13/074,262 entitled "Stacked Acoustic Resonator Comprising Bridge," filed on Mar. 29, 2011 (published as U.S. Patent App. Pub. No. 2012/0218055), which are hereby incorporated by reference in their entireties.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a first (bottom) electrode and a second (top) electrode over a cavity. BAW resonators may be used in a wide variety of electronic applications, such as cellular telephones, personal digital assistants (PDAs), electronic gaming devices, laptop computers and other portable communications devices. For example, FBARs may be used for electrical filters and voltage transformers.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonance frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, a collar may be formed by a dielectric material outside the boundary of the main membrane region to allow a smooth decay of evanescent modes emanating from the boundary and improve confinement of mechanical motion to the main membrane region. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Additionally, they may require the presence of certain additional materials that can deleteriously redistribute the acoustic energy in the acoustic stack, such as relatively soft planarization layers. Also, some design choices may produce only modest performance improvements while significantly driving up cost. Moreover, the formation of ancillary structural features may degrade structural stability or interfere with the formation of overlying layers.

In addition, conventional FBARs rely on strong confinement of electrically excited piston mode. Strong confinement is provided by the edges of the top and bottom electrodes, as well as ancillary structural features, such as air-bridges and conventional outside frames. While the apparent advantage of strong confinement is that it prevents strong electrical excitation of mechanical motion at the edge of the top electrode, it also provides significant acoustic discontinuities, leading to scattering of energy out of the desired piston mode into undesired extensional, shear, flexural and dilatational modes of the whole structure. Accordingly, in view of these and other shortcomings of conventional acoustic resonator structures, there is a general need for improved acoustic resonator designs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4 is a graph illustrating the quality factor (Q-factor) and parallel resistance Rp of the acoustic resonators of FIGS. 3A and 1B, as compared to an acoustic resonator having only a temperature compensating acoustic impedance layer.

DETAILED DESCRIPTION

Figure 1A:
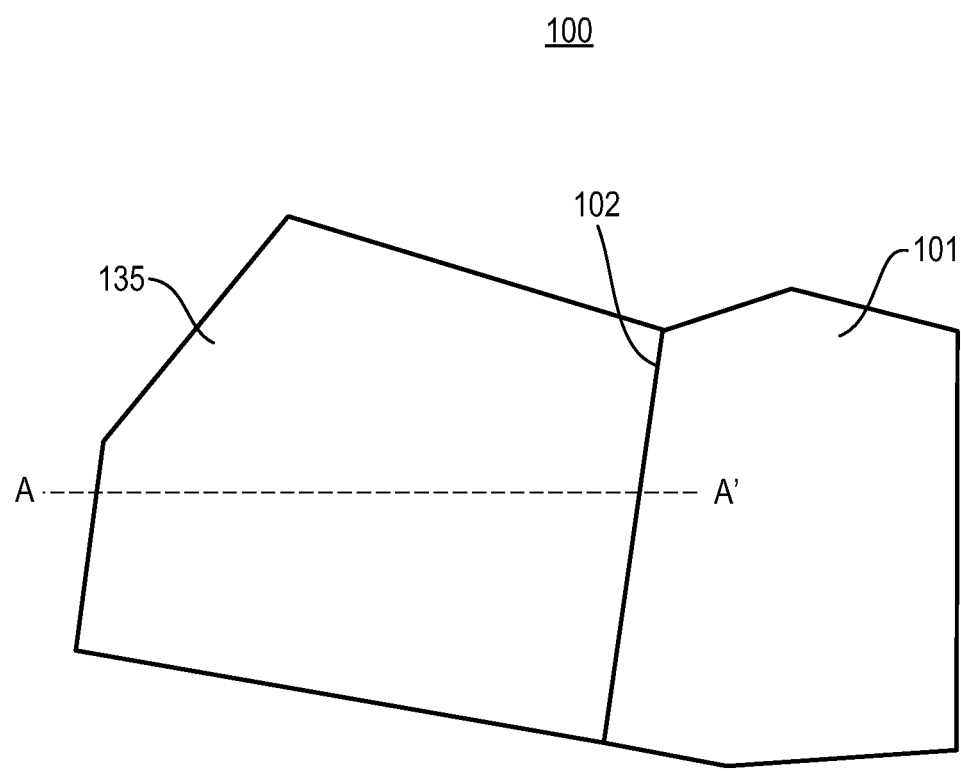
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In certain embodiments described below, an acoustic resonator comprises a piezoelectric layer disposed between top and bottom electrodes, and an acoustic reflector, such as a distributed Bragg reflector (DBR), disposed over a cavity defined by the substrate. The acoustic reflector may be formed of a single layer or multiple layers, where at least one of the layers comprises a temperature compensating layer, e.g., formed of material having a temperature coefficient that offsets temperature coefficient(s) of other component(s) of the acoustic resonator. The acoustic reflector may be formed of one or more pairs of layers formed under a bottom electrode where it minimizes a detrimental impact of a so-called "dead-FBAR" region in which acoustic vibrations of the acoustic resonator may be attenuated through mechanical scattering of the electrically excited motion at a boundary between the bottom electrode and an underlying substrate and through the transducer effect in the region where FBAR acoustic stack overlaps the substrate. Each pair of layers consists of a low acoustic impedance layer stacked on a high acoustic impedance layer.

The acoustic resonator may further include a collar disposed outside a main membrane region and/or a frame disposed within the main membrane region. The collar typically has an inner edge substantially aligned with a boundary of the main membrane region or somewhat overlapping the main membrane region, and the frame typically has an outer edge substantially aligned with the boundary of the main membrane region. The cavity may be disposed in the substrate within the main membrane region. Generally, a collar couples the evanescent thickness extensional (eTE1) and piston modes of a main membrane region to the evanescent thickness extensional mode of a collar region, and a frame suppresses excitation of propagating modes.

The collar may be formed of a relatively thick dielectric region of finite width, and may be located in various alternative locations, such as above the top electrode, below the bottom electrode, or between the bottom electrode and the piezoelectric layer. The collar may also be divided into multiple layers and formed in more than one of the above locations. Also, the collar may be formed inside other features of the acoustic resonator, for instance, inside the piezoelectric layer. A region of the acoustic resonator above and below the collar will be referred to as a collar region.

The collar is typically designed so that its cutoff frequency is substantially the same as the cutoff frequency in the main membrane region, and its main non-propagating mode (evanescent mode, for instance) has substantially the same modal distribution as the piston mode in the main membrane region. This prevents acoustic energy in the piston mode from being converted into unwanted propagating modes in the collar region and propagating and evanescent modes in the main membrane region. If excited, propagating modes in the collar region in general may lead to energy loss due to acoustic radiation to the region outside of acoustic resonator. Similarly, if excited, propagating and evanescent modes inside the main membrane region may in general produce lateral voltage gradients, which may lead to lateral current flows and energy loss due to the Joule heating. Thus, the collar may improve confinement of the piston mode within the main membrane region while suppressing the excitation of unwanted spurious lateral modes inside and outside of the main membrane region. This, in turn, may reduce overall acoustic scattering loss and enhance the parallel resistance Rp and the quality factor (Q-factor) of the acoustic resonator.

In the absence of the collar, there may be a significant acoustic impedance discontinuity at the edge of the top electrode for an electrically excited piston mode. Because the electric field is also terminated at the edge of top electrode, that edge will cause both mechanical and electrical excitation of evanescent, propagating and complex modes supported by the structures both inside and outside of the main membrane region. Evanescent and complex modes decay exponentially, so a wide enough collar structure will suppress them. Moreover, propagating modes may be suppressed by forming the collar structure with a proper width. Additionally, a collar structure extending over (or under) the top electrode may act as an integrated frame, thus it may minimize the amplitude of electrically excited piston mode before the top electrode edge and provide additional acoustic impedance discontinuities to suppress propagating modes. Thus, in the presence of a properly designed collar, most of the piston mode energy at the top electrode edge may couple to the evanescent mode in the collar region, which may then decay exponentially and become efficiently suppressed inside a wide enough collar structure. When the collar overlaps with the substrate, the acoustic reflector also prevents the evanescent and complex modes supported by the collar from coupling to the substrate.

The frame is formed by adding a layer of material, usually an electrically conducting material (although dielectric material is possible as well), to the top and/or bottom electrode. The frame can be either a composite frame or an add-on frame, for example. A composite frame has integrated lateral features, formed of aluminum (Al) and molybdenum (Mo), for example, and is formed by embedding material within the top or bottom electrode, typically with an exposed upper or lower surface being coplanar with an upper or lower surface of the top or bottom electrode. An add-on frame is formed by depositing the material above or below of a layer forming either the bottom or top electrode along a perimeter of the main membrane region. The use of a composite frame can simplify fabrication of the acoustic resonator with regard to application of layers on planar surfaces. For instance, it can prevent the formation of outcroppings in overlying layers, which can preserve the structural stability of the acoustic resonator. A region of the acoustic resonator above and below the frame will be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the main membrane region. A frame that lowers the cutoff frequency in the frame region as compared to the main membrane region will be referred to as a Low Velocity Frame (LVF), while a frame that increases the cutoff frequency in the frame region as compared to the main membrane region will be referred to as a High Velocity Frame (HVF). The reasoning behind this nomenclature is that for composite frames (for which thicknesses of the frame and main membrane regions are substantially the same), an increase or decrease of the cutoff frequency is substantially equivalent to an increase or decrease an effective sound velocity of the acoustic stack forming the frame, respectively.

A composite or add-on frame with lower effective sound velocity than the corresponding effective sound velocity of a main membrane (i.e., an LVF) generally increases parallel resistance Rp and Q-factor of the acoustic resonator above the cutoff frequency of the main membrane region. Conversely, a composite or add-on frame with a higher effective sound velocity than the corresponding effective sound velocity of a main membrane (i.e., an HVF) generally decreases series resistance Rs and increases Q-factor of the acoustic resonator below the cutoff frequency of the main membrane region. A typical low velocity frame, for example, effectively provides a region with significantly lower cutoff frequency than the main membrane region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at membrane/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of collars and frames, as well as related materials and operating characteristics, are described in the above cited U.S. patent application Ser. Nos. 13/663,449 and 13/660,941 to Burak et al., which are hereby incorporated by reference in their entireties. As explained in those applications, collars and frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or electromechanical coupling coefficient $Kt^2$. Although the following description presents several embodiments in the form of FBAR devices, several of the described concepts could be implemented in other forms of acoustic resonators, such as SMRs, for example.

FIG. 1A is a top view of an acoustic resonator 100A according to a representative embodiment, and FIGS. 1B-1F are cross-sectional views of acoustic resonator 100A, taken along a line A-A' according to different embodiments. The cross-sectional views correspond to different variations of acoustic resonator 100A and will be referred to, respectively, as acoustic resonators 100B-100F. Acoustic resonators 100B-100F have many of the same features, so a repetitive description of these features may be omitted in an effort to avoid redundancy.

Referring to FIG. 1A, acoustic resonator 100A comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100A.

FIGS. 1B-1F are cross-sectional diagrams illustrating acoustic resonators, according to representative embodiments. In the examples depicted in FIGS. 1B-1F (as well as the examples depicted in FIGS. 2A to 4, discussed below), the acoustic resonator is an FBAR, for convenience of explanation. However, it is understood that other types of acoustic resonators may be included, without departing from the scope of the present teachings. Each of the acoustic resonators shown in FIGS. 1B to 1F includes an acoustic reflector or acoustic mirror, such as a distributed Bragg reflector (DBR), formed beneath the acoustic stack over the substrate and a cavity formed in the substrate, as well as a temperature compensating feature (e.g., temperature compensating layer) located within the acoustic reflector. For example, one or more of the acoustic impedance layers in the acoustic mirror may be formed of a material enabling it to also serve as a temperature compensating layer, e.g., having a positive temperature coefficient configured to offset negative temperature coefficients of other materials in the acoustic stack. It is understood that the same general configurations may be included in acoustic resonators having frames and/or collars in various locations, without departing from the scope of the present teachings.

Figure 1B:
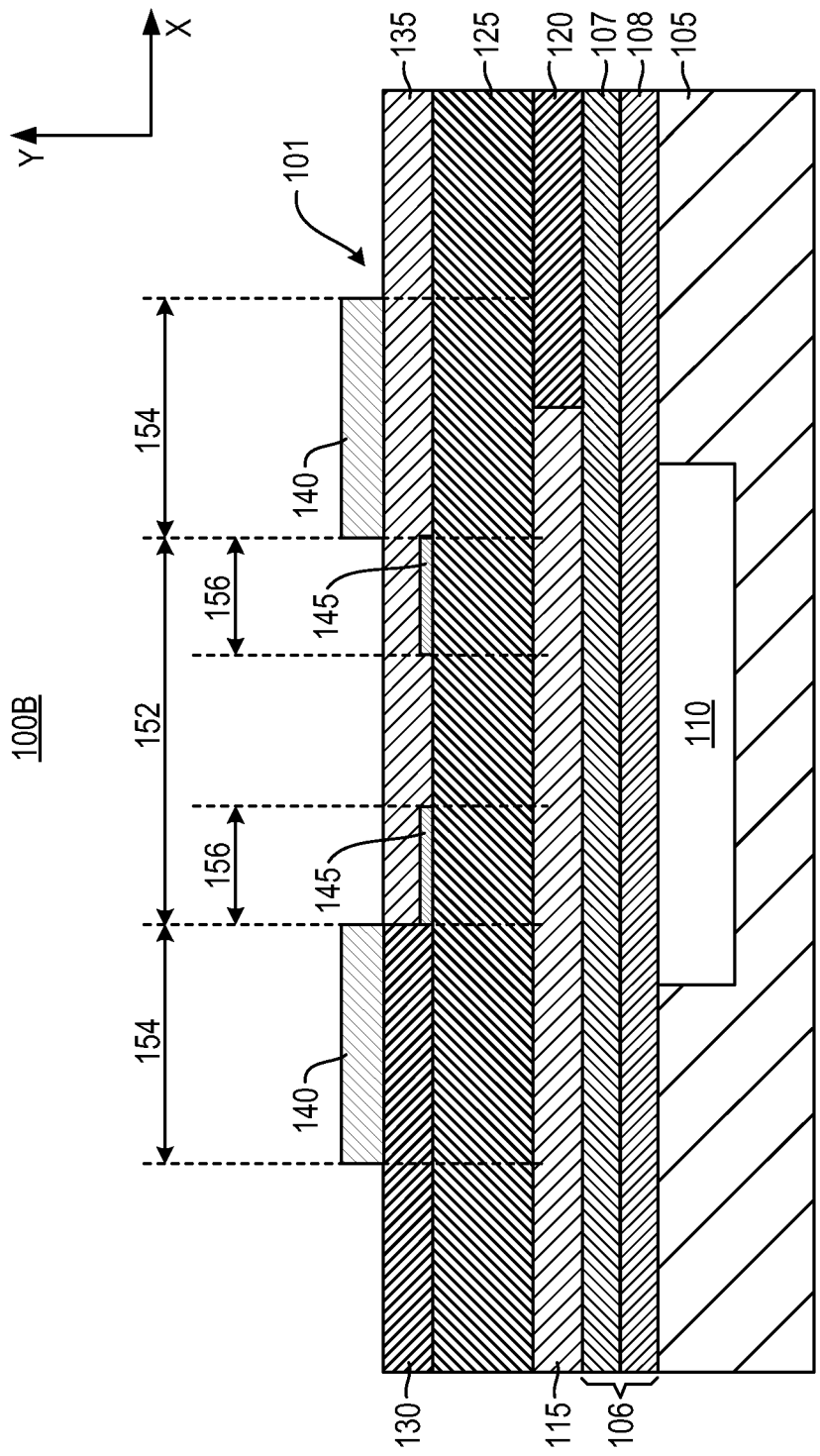
FIG. 1B is a cross-sectional view of an acoustic resonator according to a representative embodiment.

Referring to FIG. 1B, acoustic resonator 100B, which may be an FBAR, for example, comprises a substrate 105, a cavity 110 (e.g., air cavity) and an acoustic reflector, indicated by illustrative distributed Bragg reflector (DBR) 106, formed over a top surface of the substrate 105 and the cavity 110. The DBR 106 includes one or more pairs of acoustic impedance layers, indicated by representative first acoustic impedance layer 107 and second acoustic impedance layer 108, discussed below, and a temperature compensating feature. A bottom (first) electrode 115 is disposed on the DBR 106, and a first planarization layer 120 is disposed on the DBR 106 adjacent to the bottom electrode 115. A piezoelectric layer 125 is disposed on the bottom electrode 115 and the first planarization layer 120. A top (second) electrode 135 is disposed on the piezoelectric layer 125. Collectively, the bottom electrode 115, the piezoelectric layer 125, and the top electrode 135 constitute an acoustic stack of acoustic resonator 100B. A second planarization layer 130 is disposed on the piezoelectric layer 125 adjacent to the top electrode 135 to accommodate collar 140, although the second planarization layer 130 is not needed if there is no collar or if the collar is located elsewhere in the acoustic stack, as discussed below.

The first and second acoustic impedance layers 107 and 108 may be formed with respective thicknesses corresponding to a quarter wavelength of a natural resonance frequency of acoustic resonator 100B, for example. Generally, the amount of acoustic isolation provided by DBR 106 depends on the contrast between the acoustic impedances of adjacent acoustic impedance layers, with a greater amount of contrast creating better acoustic isolation. In some embodiments, the DBR 106 is formed in pairs of dielectric materials having contrasting acoustic impedances. For example, in the depicted embodiment, the DBR 106 comprises a single pair of acoustic impedance layers, first acoustic impedance layer 107 and second acoustic impedance layer 108, where the first acoustic impedance layer 107 is formed of a material having relatively low acoustic impedance (which may be a relatively soft material) and the second acoustic impedance layer 108 paired with the first acoustic impedance layer 107 is formed of a material having relatively high acoustic impedance (which may be a relatively hard material).

Of course, in various embodiments, the DBR 106 may include other numbers of acoustic impedance layers and/or acoustic impedance layer pairs, e.g., to achieve specific design objectives, without departing from the scope of the present teachings. For example, in the presence of the cavity 110, the DBR 106 may be formed of a single half-wavelength layer rather than a quarter-wavelength layer in order to preserve the designed resonance frequency of acoustic resonator 100B. In another example, the DBR 106 may be formed of multiple pairs of acoustic impedance layers. When there are additional acoustic impedance layer pairs in the DBR 106, each pair likewise includes a first acoustic impedance layer (107) formed of low acoustic impedance material stacked on a second acoustic impedance layer (108) formed of high acoustic impedance material. Various illustrative fabrication techniques of acoustic mirrors are described by in U.S. Pat. No. 7,358,831 (Apr. 15, 2008), to Larson III, et al., which is hereby incorporated by reference in its entirety.

As mentioned above, the DBR 106 includes a temperature compensating feature. That is, at least one of the acoustic impedance layers of the DBR 106 having relatively low acoustic impedance (e.g., first acoustic impedance layer 107) is formed of a material that also provides temperature compensation for the acoustic resonator 100B. Such materials include boron silicate glass (BSG), tetra-ethyl-ortho-silicate (TEOS), silicon dioxide ($SiO_2$), and niobium molybdenum (NbMo), for example, which have positive temperature coefficients. The positive temperature coefficient of the temperature compensating acoustic impedance layer offsets negative temperature coefficients of other materials in the acoustic stack, including the piezoelectric layer 125, the bottom electrode 115, and the top electrode 135, for example. Various illustrative fabrication techniques of temperature compensating layers are described by U.S. patent application Ser. No. 13/766,993 (filed Feb. 14, 2013), to Burak et al., which is hereby incorporated by reference in its entirety.

The second acoustic impedance layer 108 paired with the first acoustic impedance layer 107 is formed of a material having relatively high acoustic impedance, such as tungsten (W) or molybdenum (Mo), for example. In embodiments in which the DBR 106 includes more than one pair of first (low) and second (high) acoustic impedance layers, the low acoustic impedance layer in each pair may be formed of the same temperature compensating material as the first acoustic impedance layer 107, a different temperature compensating material, or a low acoustic impedance material having no effective temperature compensating attributes, without departing from the scope of the present teachings. For example, other low acoustic impedance layers may be formed of materials, such as borosilicate glass (BSG), tetra-ethyl-ortho-silicate (TEOS), silicon oxide ($SiO_x$) or silicon nitride ($SiN_x$), where x is an integer, carbon-doped silicon oxide (CDO), chemical vapor deposition silicon carbide (CVD SiC), or plasma enhanced CVD SiC (PECVD SiC). In another example, the additional low acoustic impedance layers (odd acoustic impedance layers) may be formed of carbon-doped silicon oxide (CDO), while the corresponding high acoustic impedance layers (even acoustic impedance layers) paired with low acoustic impedance layers may be formed of silicon nitride ($SiN_x$), where x is an integer. A benefit of this latter pairing of materials is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. Of course, the low and high acoustic impedance materials forming the stacked layers of the DBR 106 may vary without departing from the scope of the present teachings.

The relative thicknesses of the temperature compensating acoustic impedance layer (first acoustic impedance layer 107) and the non-temperature compensating acoustic impedance layer (second acoustic impedance layer 108) should be optimized in order to maximize the coupling coefficient for an allowable linear temperature coefficient. This optimization may be accomplished, for example, by modeling an equivalent circuit of the acoustic stack using a Mason model, as would be apparent to one of ordinary skill in the art. Although there is some degradation in the offsetting effects of the temperature coefficient by making the first acoustic impedance layer 107 thinner, the coupling coefficient of the acoustic resonator 100B may be improved. An algorithm may be developed to optimize the thicknesses of the first acoustic impedance layer 107 and the second acoustic impedance layer 108 in the DBR 106 in light of the trade-off between the temperature coefficient and the coupling coefficient, for example, using a multivariate optimization technique, such as a Simplex method, as would be apparent to one of ordinary skill in the art. Such optimization and corresponding considerations regarding temperature compensation are also applicable to the other FBARs discussed herein (e.g., acoustic resonators 100C to 300D, discussed below).

Generally, the DBR 106 substantially eliminates "dead-FBAR" by providing acoustic isolation of a connecting edge of the top electrode 135 from the substrate 105. The DBR 106 also prevents evanescent and complex modes of the region outside of the top electrode 135 (between the top electrode edge and the substrate edge) from coupling to the substrate 105, as evanescent and complex modes decay exponentially from the excitation edge located at the edge of the top electrode 135. Further, the temperature compensating first acoustic impedance layer 107 stabilizes changes of the sound velocity of the bottom electrode 115, the piezoelectric layer 125 and the top electrode 135 layers in response to changes in temperature.

Notably, FIG. 1B depicts a single acoustic resonator 100B. If the acoustic resonator 100B were to be included in a device with additional acoustic resonators, for example, in a filter including 5-10 acoustic resonators, the first and second acoustic impedance layers 107 and 108 of the DBR 106 would need to be electrically isolated from DBRs of the other acoustic resonators, as would be apparent to one of ordinary skill in the art. For example, a trench or other isolating means may be etched off around the DBR 106 down to the substrate 105.

The bottom electrode 115 may be formed of one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In various configurations, the bottom electrode 115 may be formed of two or more layers of electrically conductive materials, which may by the same as or different from one another. Likewise, the top electrode 135 may be formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In various configurations, the top electrode 135 may be formed of two or more layers of electrically conductive materials, which may by the same as or different from one another. Also, the configuration and/or the material(s) forming the top electrode 135 may be the same as or different from the configuration and/or the material(s) forming the bottom electrode 115.

The substrate 105 may be formed of a material compatible with semiconductor processes, such as silicon (Si), gallium arsenide (GaAs), indium phosphide (InP), glass, sapphire, alumina, or the like, for example. Various illustrative fabrication techniques for an air cavity in a substrate are described by U.S. Pat. No. 7,345,410 (Mar. 18, 2008), to Grannen et al., which is hereby incorporated by reference in its entirety. The piezoelectric layer 125 may be formed of any piezoelectric material compatible with semiconductor processes, such as aluminum nitride (AlN), zinc oxide (ZnO), or zirconate titanate (PZT), for example.

The first planarization layer 120 may be formed of borosilicate glass (BSG), for example. The first planarization layer 120 is not strictly required for the functioning of acoustic resonator 100B, but its presence can confer various benefits. For instance, the presence of the first planarization layer 120 tends to improve the structural stability of acoustic resonator 100B, may improve the quality of growth of subsequent layers, and may allow bottom electrode 115 to be formed without its edges extending beyond the cavity 110. Further examples of potential benefits of planarization are presented in U.S. Patent App. Pub. No. 2013/0106534 to Burak et al., which is hereby incorporated by reference in its entirety.

Referring again to FIG. 1B, the acoustic resonator 100B further comprises a collar 140 disposed on the second planarization layer 130 and the top electrode 135, and a frame 145 disposed in a bottom portion of the top electrode 135. Although not shown, a passivation layer may be present on top of the top electrode 135 with thickness sufficient to insulate all layers of the acoustic stack from the environment, including protection from moisture, corrosives, contaminants, debris and the like. The collar 140 may be formed of a dielectric material of predetermined thickness and width that substantially surrounds the main membrane region. The dielectric material may be silicon dioxide ($SiO_2$), silicon nitride (SiN), silicon carbide (SiC), aluminum nitride (AlN), zinc oxide (ZnO), aluminum oxide ($Al_2O_3$), diamond, diamond like carbon (DLC), or lead zirconium titanate (PZT), for example. The frame 145 may be formed of one or more conductive or dielectric materials, such as copper (Cu), molybdenum (Mo), aluminum (Al), tungsten (W), iridium (Ir), borosilicate glass (BSG), carbon-doped silicon oxide (CDO), silicon carbide (SiC), silicon nitride (SiN), silicon dioxide ($SiO_2$), aluminum oxide ($Al_2O_3$), aluminum nitride (AlN), zinc oxide (ZnO), lead zirconium titanate (PZT), diamond or diamond-like carbon (DLC), for example.

The second planarization layer 130 may be formed of borosilicate glass (BSG), for example. Notably, the use of a high acoustic impedance material in the second planarization layer 130, tends to produce a vertical modal energy distribution across the acoustic stack in the region of the collar 140 that matches more closely a vertical modal energy distribution across the acoustic stack in the active region. This allows a closer match between a vertical distribution of the modal energy distribution of electrically excited piston mode in the active region and a vertical modal energy distribution of the evanescent thickness extensional (eTE1) mode in the region of the collar 140 at frequencies around the series resonance frequency Fs of the acoustic resonator 100B. The eTE1 mode may then decay exponentially in the direction away from the collar/membrane interface without coupling to other propagating modes supported by the acoustic resonator 100B structure. This in turn may result in overall reduced scattering loss in the collar region and may produce significant improvements in parallel resistance Rp and quality factor Q. Moreover, use of higher acoustic impedance materials in the collar 140 and the passivation layer may also contribute to improved performance for similar reasons.

Of course, other materials may be incorporated into the above and other features of acoustic resonator 100B without departing from the scope of the present teachings.

A double-headed arrow 152 indicates a main membrane region, or active region, of the acoustic resonator 100B, and dotted vertical lines indicate a boundary of the main membrane region 152. This boundary coincides with the edge of the top electrode 135, except on connecting side 101, where the top electrode 135 extends beyond the boundary of the main membrane region 152. Double-headed arrows 154 and 156 indicate respective collar and frame regions of acoustic resonator 100B, and corresponding dotted vertical lines indicate boundaries of these regions. When viewed from a top angle, such as that of FIG. 1A, the above regions and their boundaries may have an apodized shape. As illustrated in FIG. 1B, the collar 140 has an inner edge that is substantially aligned with the boundary of the main membrane region 152, and the frame 145 has an outer edge that is substantially aligned with the same boundary.

In the example of FIG. 1B, the main membrane region 152 does not include the full extent of overlap between bottom and top electrodes 115 and 135 and piezoelectric layer 125, because the illustrated right side of top electrode 135 is a connecting edge and it is not intended to modify the characteristic electrical impedance at an operating frequency range of the acoustic resonator 100B in any significant way. However, an overlap between the bottom electrode 115, the piezoelectric layer 125, the top electrode 135 and the substrate 105 in the top electrode connecting edge, usually referred to as dead-FBAR, may cause significant acoustic energy loss since piston mode is electrically excited all the way to the outer perimeter of the cavity 110 in that region, where it may couple to propagating modes supported by the substrate 105 region. The presence of the collar 140 in that region may minimize that unwanted energy loss by mass-loading the top-electrode connecting edge, which in turn significantly lowers the amplitude of electrically excited piston mode at an outer edge of the cavity 110.

During typical operation of acoustic resonator 100B, as a part of a ladder filter, for instance, an input electrical signal may be applied to an input terminal of the bottom electrode 115 and the top electrode 135 may be connected to the output terminal. The input electrical signal may include a time-varying voltage that causes vibration in the main membrane region. This vibration in turn produces an output electrical signal at an output terminal of the top electrode 135. The input and output terminals may be connected to bottom and top electrodes 115 and 135 via connection edges that extend away from the main membrane region 152 as shown in FIG. 1B. For example, from a top view, these connection edges may be seen to extend outside of an apodized pentagon shape, such as that illustrated in FIG. 1A. The input and output terminals of acoustic resonator 100B may be connected to appropriate terminals of other acoustic resonators forming the ladder filter, for instance.

The electrically excited piston mode is terminated at the edge of top electrode 135. This structural discontinuity at the edge of top electrode 135 presents a significant discontinuity in cutoff frequencies between the main membrane region 152 and peripheral regions, and it causes excitation of lateral modes in both the main membrane and peripheral regions to facilitate continuity of appropriate particle velocity and stress components at the interface between these regions. This can lead to undesirable scattering of acoustic energy from the piston mode and the resulting degradation of electrical response of acoustic resonator 100B. Collar 140, however, provides mass loading which lowers the cutoff frequency outside the main membrane region 152, producing a more laterally uniform cutoff frequency profile across acoustic resonator 100B. Similarly, frame 145 suppresses electrically excited piston mode in the frame region, and it reflects and otherwise resonantly (exponentially) suppresses propagating (evanescent and complex) eigenmodes in lateral directions, with both effects simultaneously improving operation of acoustic resonator 100B. In other words, performance improvement of acoustic resonator 100B is facilitated by at least one of a cutoff frequency mismatch and an acoustic impedance mismatch between the frame region and other portions of the main membrane region 152 which is produced by frame 145.

Meanwhile, as discussed above, the DBR 106 generally mitigates acoustic losses in the vertical direction (y-dimension in the coordinate system depicted in FIG. 1B) of the acoustic resonator 100B, and the temperature compensating first acoustic impedance layer 107 stabilizes response by offsetting at least a portion of a negative temperature coefficient of the piezoelectric layer 125, the bottom electrode 115 and the top electrode 135. The principle of operation of the DBR 106 relies on the fact that, due to destructive interference of an incident acoustic wave, its total amplitude decays exponentially in the direction of propagation through the acoustic stack (in this case away from the interface between bottom electrode 115 and first acoustic impedance layer 107). In general, such beneficial exponential decay of wave amplitude is only possible if the thicknesses of the first and second acoustic impedance layers 107 and 108 (and any additional acoustic impedance layers) comprising DBR 106 are equal to or close to equal to an odd multiple of the quarter wavelength of an incident acoustic wave. At the bottom of the DBR stack (in this case at the interface between second acoustic impedance layer 108 and the substrate 105), the wave amplitude is small, thus yielding negligible radiation of acoustic energy into the substrate 105. In other words, the acoustic energy incident upon the DBR 106 is being reflected back with only small transmission of acoustic energy into the substrate 105. Notably, the beneficial reflectivity properties of the DBR 106 are in general possible for a limited range of frequencies, a specific polarization and a limited range of propagation angles of an incident wave. In practical cases when the range of frequencies is given by a bandwidth of a filter and multiple eigenmodes are being excited in the active region, the optimal thicknesses of the various acoustic impedance layers are found numerically and experimentally.

Also as mentioned above, the use of two acoustic impedance layers (e.g., the first and second acoustic impedance layers 107, 108) is merely illustrative, and the DBR 106 may comprise more than two acoustic impedance layers, or a single acoustic impedance layer. The number of acoustic impedance layers provided for the DBR 106 is determined by a tradeoff between expected reflection performance (the more layers the better) and cost and processing issues (the fewer layers the cheaper and more straightforward mirror growth and post-processing). Furthermore, depending on the acoustic impedance of the substrate 105, the second acoustic impedance layer 108 may be foregone, with the first acoustic impedance layer 107 being disposed directly over the substrate 105 and having its thickness increased to be half-wavelength (rather than a quarter-wavelength). The amount of acoustic isolation of the excited eigenmodes provided by the DBR 106 also depends on the contrast between the acoustic impedances of the adjacent acoustic impedance layers, with a greater amount of contrast creating better acoustic reflection of the eigenmodes with dominant vertical polarization component, as discussed above.

In an embodiment, the cavity 110 may be formed before the DBR 106, and filled with sacrificial material, which is subsequently released after formation of the DBR 106 and the additional layers of the acoustic resonator 100B. The acoustic impedance layers of the DBR 106 are provided over the substrate 105 using materials deposited by known methods. For example, the second acoustic impedance layer 108 may be formed over the substrate 105, and the first acoustic impedance layer 107 is formed over the second acoustic impedance layer 108. Alternatively, the first acoustic impedance layer 107 may be formed over the substrate 105 directly. Still alternatively, additional acoustic impedance layers (not shown) may be provided between the second acoustic impedance layer 108 and the first acoustic impedance layer 107. In all embodiments, however, the first acoustic impedance layer 107, which has comparatively low acoustic impedance, is provided beneath the bottom electrode 115. The layers of the DBR 106 can be fabricated using various known methods, an example of which is described in U.S. Pat. No. 7,358,831 (Apr. 15, 2008) to Larson, III, et al., the disclosure of which is hereby incorporated by reference in its entirety.

In general, the main membrane region 152 of FBAR 100B is defined by the presence of air (essentially zero acoustic impedance material) at both top and bottom boundaries. Therefore vertical stress components are zero at these boundaries. Similarly, through proper selection of materials in the DBR 106, the first acoustic impedance layer 107 may have very low acoustic impedance compared to the bottom electrode 115, which may also lead to a lowered vertical stress at the boundary between the bottom electrode 115 and the first acoustic impedance layer 107. Such a lowered stress condition is however only possible when thickness of the first acoustic impedance layer 107 is reasonably close to an odd multiple of the quarter wavelength of the modes (e.g., in this case electrically driven piston mode and eTE1 eigenmode) for which the DBR 106 is being designed. Adding more acoustic impedance layers to the DBR 106 further lowers the vertical stress at the interface between the bottom electrode 115 and the first acoustic impedance layer 107, thus allowing for closer approximation of an ideal zero-stress condition.

However, as mentioned above, while lower vertical stress for electrically driven piston mode and eTE1 eigenmode is realized by the selection of the thickness of the first acoustic impedance layer 107, for other modes which are excited either electrically or mechanically (by modal coupling at the lateral edges of the membrane) that may not necessarily be the case and leakage of these modes through the DBR 106 may be actually enhanced (leading to lesser than expected energy confinement). For instance, presence of relatively thick first acoustic impedance layer 107 with low acoustic impedance generally lowers the cutoff frequency of the second order thickness shear mode TS2, which in turn increases the shear component in the eTE1 mode at the parallel resonance frequency Fp resulting in weaker coupling of eTE1 modes supported by the collar 140 on either side of the cavity 110 edge. That weaker coupling causes stronger excitation of propagating modes and increased radiative loss, as described above in relation to collar operating principles. In other words, proximity of TS2 resonance to TE1 resonance in the DBR 106 region may increase lateral leakage of acoustic energy. To address that problem, a thinner than quarter wavelength first acoustic impedance layer 107 may be used, which in turn may adversely reduce overall reflectivity of DBR 106 in vertical direction and temperature compensating properties of DBR 106. The proper balance between these two leakage mechanisms and temperature compensation is usually determined by numerical simulations and experiments.

In general, the depth of the cavity 110 is determined by the etch properties of the sacrificial material and by possible downward bowing of the released membrane (i.e., layers of the acoustic resonator 100B disposed over the cavity 110) in the case of residual compressive stress in the layers of the membrane being present. Usually deeper cavities are more beneficial from the membrane release process point of view, but they also yield somewhat more difficult initial etch process. If the above mentioned features of the release process require deeper cavities, one can increase the depth of the cavity 110 by continued etching of the substrate 105 until required distance between the DBR 106 and the bottom of the cavity 110 is obtained.

The first and second acoustic impedance layers 107 and 108 have thicknesses in the range of approximately 1000 Å to approximately 50000 Å, respectively, depending on the material used and the frequency operating range of the filter. As mentioned above, the total thickness of all acoustic impedance layers comprising the DBR 106 is substantially equal to one quarter-wavelength of the fundamental mode in the selected material and excited at the selected operational frequency (e.g., series resonance frequency). For example, if the first acoustic impedance layer 107 comprises TEOS for operation at about 800 MHz (series resonance frequency), the first acoustic impedance layer 107 has a thickness of approximately 2.6 μm. In this example, second acoustic impedance layer 108 may comprise SiN, having a thickness of approximately 3.2 μm for operation at about 800 MHz. Notably, the thickness of all acoustic impedance layers of the DBR 106 can be selected to be odd-multiple (e.g., 5) quarter-wavelengths of the fundamental acoustic resonator eigenmode in the selected material (e.g., if one quarter-wavelength layer is too thin for practical processing).

Figure 1C:
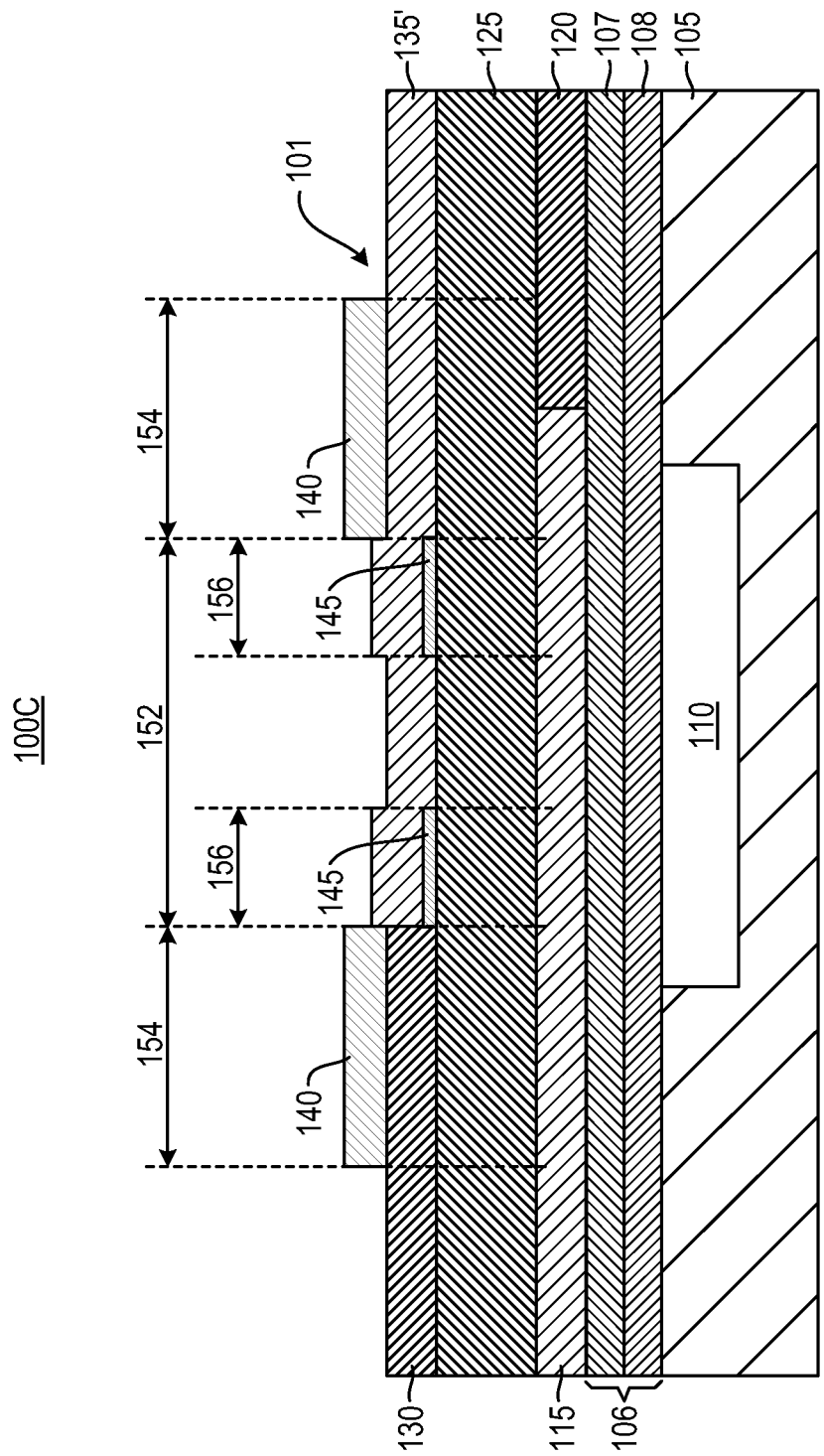
FIG. 1C is a cross-sectional view of an acoustic resonator according to another representative embodiment.

Referring to FIG. 1C, the acoustic resonator 100C is similar to the acoustic resonator 100B, except for formation of the frame 145. That is, unlike acoustic resonator 100B, in which the frame 145 is a composite frame (integrally formed within a corresponding electrode to provide planar top surfaces), the frame 145 in top electrode 135' of the acoustic resonator 100C is an add-on frame. An add-on frame results in a substantially non-planar top surface profile of the top electrode 135'.

Generally, because only a passivation layer usually would be formed on the top electrode 135', such non-planar profiles of the top electrode 135' would not have any significant impact on structural robustness of the acoustic resonator 100C. On the other hand, frames 150 and 150' in acoustic resonators 100D and 100F, discussed below, would be composite frames if included in acoustic resonator 100C, resulting in substantially planar top surface profiles of the electrodes 115. Such substantially planar top surfaces would be preferable in the bottom electrode 115 of acoustic resonator 100C in order to form a high quality, void-free piezoelectric layer 125 and top electrode 135'. Some additional general tradeoffs of different frame configurations are described, for instance, in the above cited U.S. patent application Ser. No. 13/663,449. Of course, the structure of the add-on frame 145 may be applied to frames included in the acoustic resonators 100D through 300D, without departing from the scope of the present teachings. In addition, other frame configurations (add-on and composite) may be incorporated, such as additional frame configurations disclosed by U.S. patent application Ser. No. 13/781,491, filed Feb. 28, 2013, for example, without departing from the scope of the present teachings.

Otherwise, the acoustic resonator 100C includes substrate 105, cavity 110, DBR 106 disposed over the substrate 105 and the cavity 110, bottom electrode 115 disposed on the DBR 106, and first planarization layer 120 is disposed on the DBR 106 adjacent to the bottom electrode 115. Piezoelectric layer 125 is disposed on the bottom electrode 115 and the first planarization layer 120, and the top electrode 135 and second planarization layer 130 are disposed on the piezoelectric layer 125. The DBR 106 includes first and second acoustic impedance layers 107 and 108, where the first acoustic impedance layer 107 is formed of a material having relatively low acoustic impedance and the second acoustic impedance layer 108 is formed of a material having relatively high acoustic impedance, although additional acoustic impedance layers may be included. Also, the first acoustic impedance layer 107 is configured to act as a temperature compensating layer, in that the low acoustic impedance material of which it is formed has a positive temperature coefficient that offsets the negative temperature coefficients of at least the bottom electrode 115, the piezoelectric layer 125 and/or the top electrode 135.

Figure 1D:
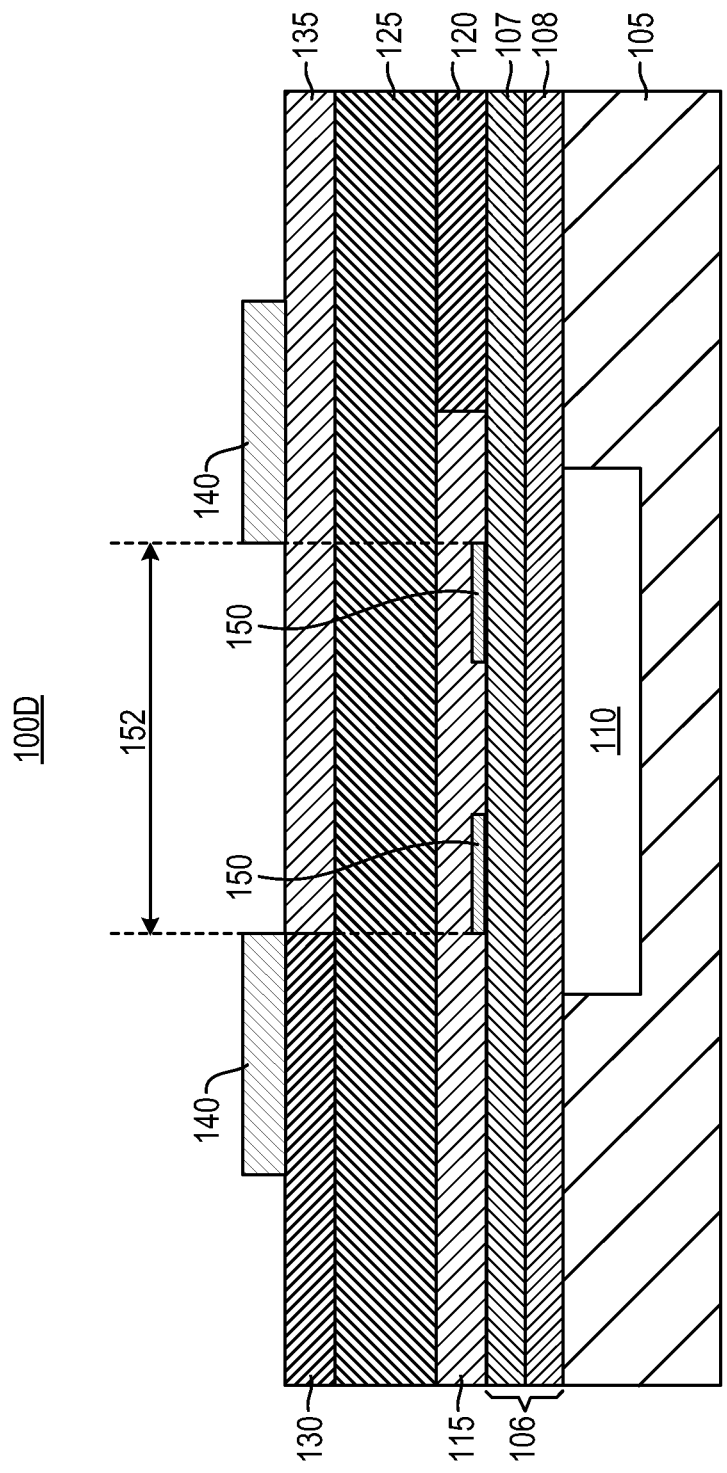
FIG. 1D is a cross-sectional view of an acoustic resonator according to another representative embodiment.
Figure 1E:
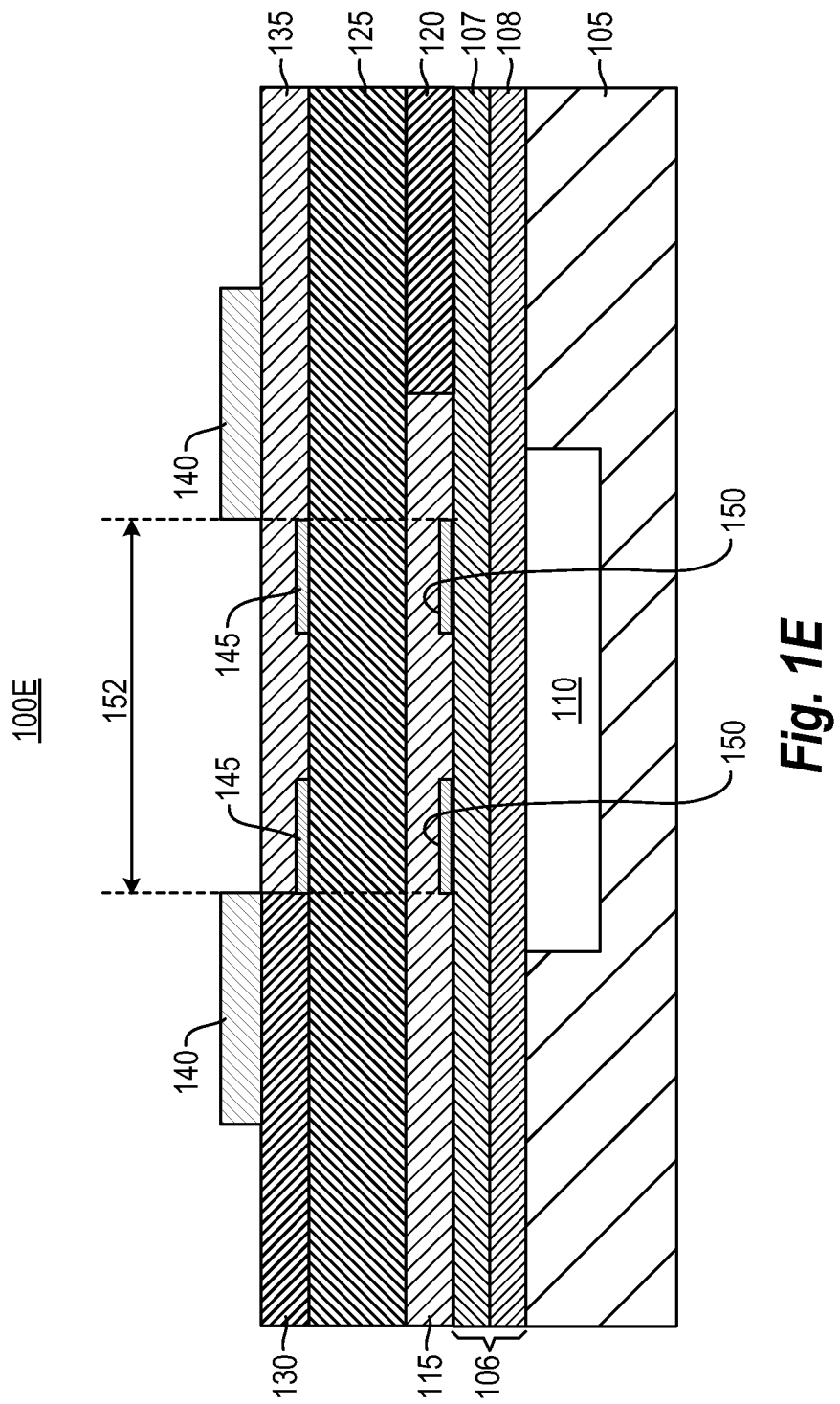
FIG. 1E is a cross-sectional view of an acoustic resonator according to another representative embodiment.
Figure 1F:
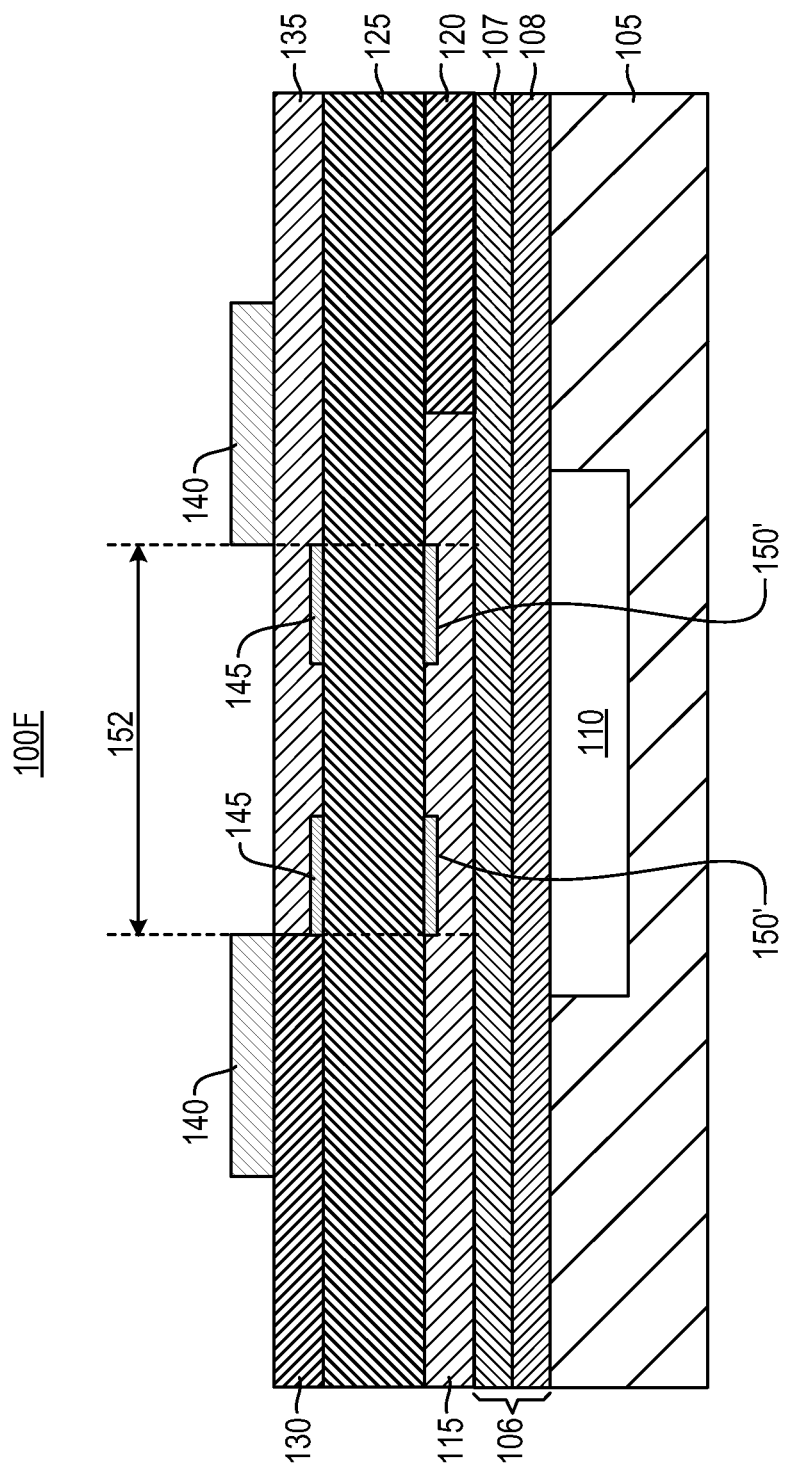
FIG. 1F is a cross-sectional view of an acoustic resonator according to another representative embodiment.

FIGS. 1D, 1E and 1F depict additional variations of the acoustic resonator 100B. In particular, in FIG. 1D, acoustic resonator 100D is substantially the same as acoustic resonator 100B, except that frame 145 is omitted and frame 150 is located at a bottom portion of bottom electrode 115. In FIG. 1E, acoustic resonator 100E is substantially the same as acoustic resonator 100B, except that frame 150 is provided at a bottom portion of bottom electrode 115, in addition to frame 145 in the top electrode 135. In FIG. 1F, acoustic resonator 100F is substantially the same as acoustic resonator 100B, except that frame 150' is provided at a top portion of bottom electrode 115, in addition to frame 145 in the top electrode 135. Of course, each of the acoustic resonators 100C through 100F include the DBR 106 with first and second acoustic impedance layers 107 and 108, where the first acoustic impedance layer 107 is formed of a material having relatively low acoustic impedance and the second acoustic impedance layer 108 is formed of a material having relatively high acoustic impedance, although additional acoustic impedance layers may be included. The first acoustic impedance layer 107 is configured also to act as a temperature compensating layer, in that the low acoustic impedance material of which it is formed has a positive temperature coefficient that offsets the negative temperature coefficients of at least the bottom electrode 115, the piezoelectric layer 125 and/or the top electrode 135.

The frames 150 and 150' in acoustic resonators 100D through 100F provide benefits similar to frame 145 of acoustic resonator 100B, although their performance and manufacturing processes will vary somewhat due to the different locations of the frames. Some general tradeoffs of different frame configurations are described, for instance, in the above cited U.S. patent application Ser. No. 13/660,941.

Generally, the temperature compensating first acoustic impedance layer 107 in acoustic resonators 100B through 100F will tend to decrease the electromechanical coupling coefficient $Kt^2$ of the corresponding acoustic resonator device. In order to compensate, the piezoelectric layer 125 may be formed of materials with intrinsically higher piezoelectric coupling coefficient (e.g., ZnO instead of AlN). Also, in various embodiments, the piezoelectric layer 125 may be "doped" with one or more rare earth elements, such as scandium (Sc), yttrium (Y), lanthanum (La), or erbium (Er), for example, to increase the piezoelectric coupling coefficient $e_{33}$ in the piezoelectric layer 125, thereby offsetting at least a portion of the degradation of the electromechanical coupling coefficient $Kt^2$ of the acoustic resonator caused by the temperature compensating first acoustic impedance layer 107. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al., and U.S. patent application Ser. No. 13/662,460 (filed Oct. 27, 2012), to Grannen et al., which are hereby incorporated by reference in their entireties. Of course, doping piezoelectric layers with one or more rare earth elements may be applied to any of various embodiments, including the embodiments described with reference to FIGS. 1B through 3D.

FIGS. 2A-2D are cross-sectional diagrams illustrating acoustic resonators, according to representative embodiments, including various arrangements of collars and frames.

FIGS. 2A through 2D are cross-sectional views of acoustic resonators 200A through 200D, respectively, according to other representative embodiments. The acoustic resonators 200A through 200D are similar to acoustic resonators 100B through 100F, respectively, except that collar 140 is omitted and a collar 240 is instead formed between bottom electrode 115 and piezoelectric layer 125. The collar 240 provides benefits similar to the collar 140 of acoustic resonators 100B through 100F, although its performance and manufacture vary somewhat due to the different location of the collar 240.

Referring to FIGS. 2A through 2D, each of acoustic resonators 200A through 200D, which may be an FBAR, for example, includes substrate 105, cavity 110, DBR 106 disposed over the substrate 105 and the cavity 110, bottom electrode 115, 215 disposed on the DBR 106, and first planarization layer 120 is disposed on the DBR 106 adjacent to the bottom electrode 115, 215. Piezoelectric layer 125 is disposed on the bottom electrode 115, 215 and the first planarization layer 120, and the top electrode 135, 235 and second planarization layer 130 are disposed on the piezoelectric layer 125. The DBR 106 includes first and second acoustic impedance layers 107 and 108, where the first acoustic impedance layer 107 is formed of a material having relatively low acoustic impedance and the second acoustic impedance layer 108 is formed of a material having relatively high acoustic impedance, although additional acoustic impedance layers may be included. Also, the first acoustic impedance layer 107 is configured to act as a temperature compensating layer, in that the low acoustic impedance material of which it is formed has a positive temperature coefficient that offsets the negative temperature coefficients of at least the bottom electrode 115, 215, the piezoelectric layer 125 and/or the top electrode 135, 235.

Figure 2A:
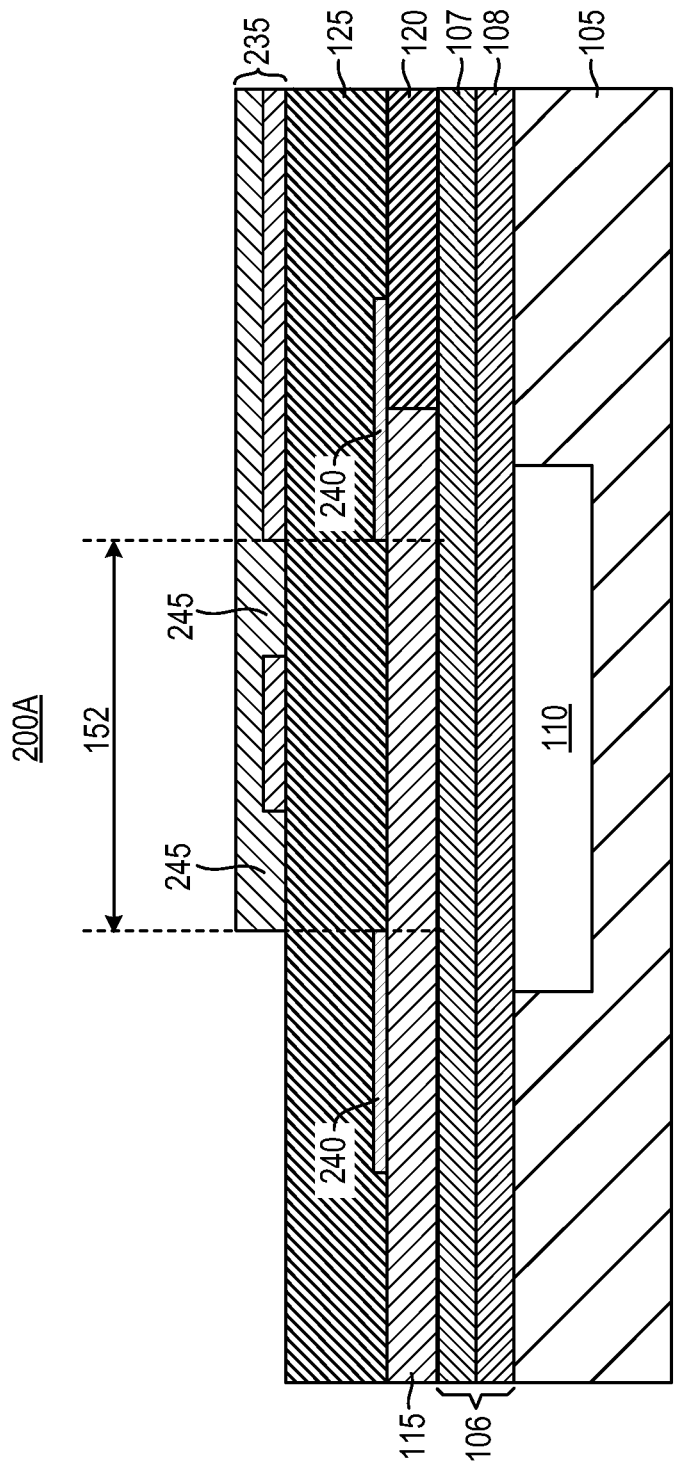
FIG. 2A is a cross-sectional view of an acoustic resonator according to another representative embodiment.
Figure 2B:
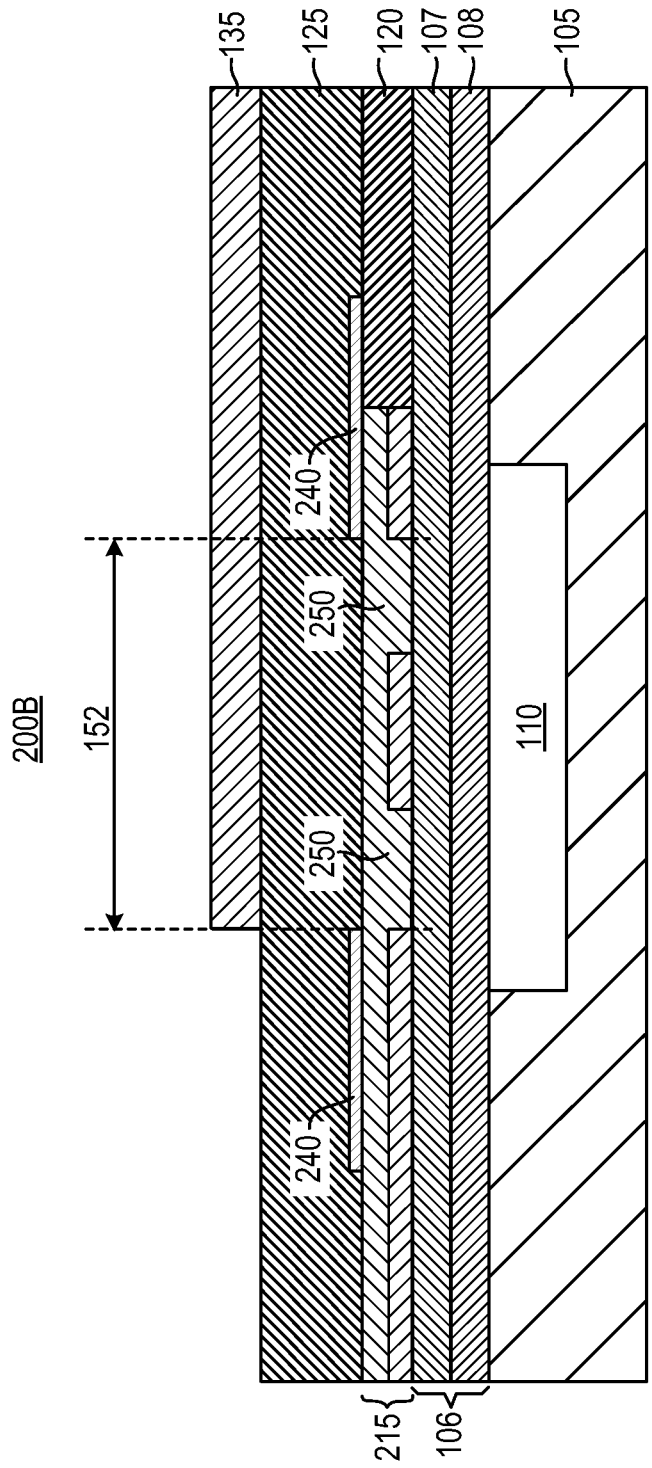
FIG. 2B is a cross-sectional view of an acoustic resonator according to another representative embodiment.
Figure 2C:
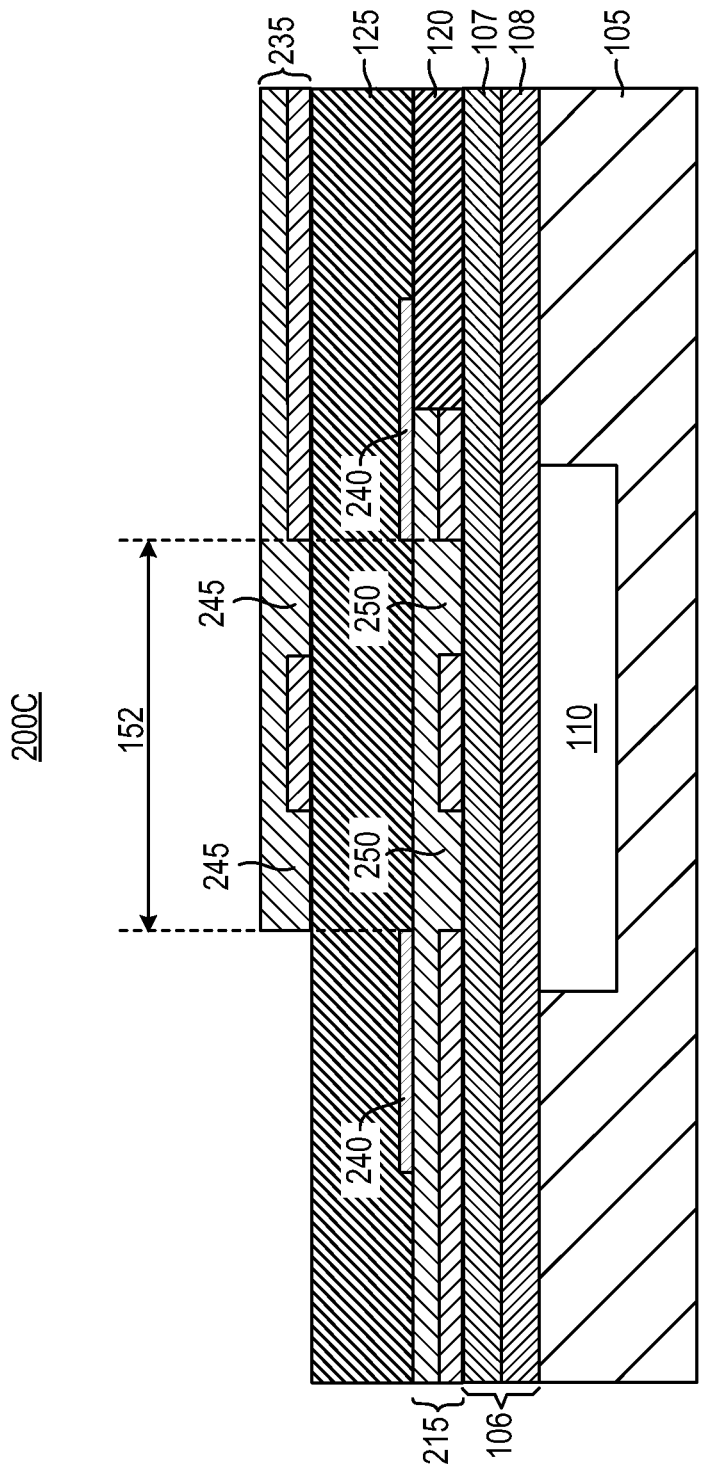
FIG. 2C is a cross-sectional view of an acoustic resonator according to another representative embodiment.
Figure 2D:
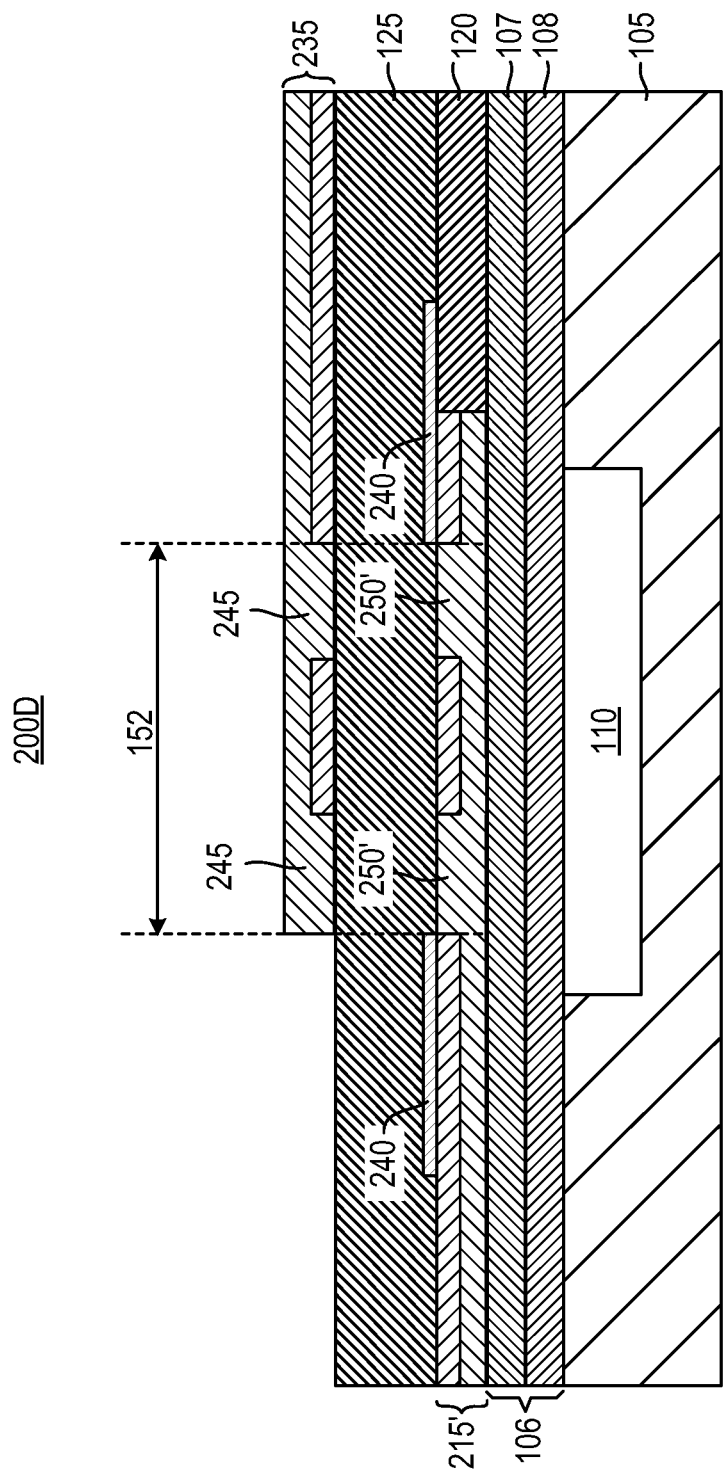
FIG. 2D is a cross-sectional view of an acoustic resonator according to another representative embodiment.

Note that for illustrative purposes, the frame 245 formed in the top electrode 235 and frames 250 and 250' formed in the bottom electrode 215 of the acoustic resonators 200A through 200D are constructed differently than the frame 145 of in the top electrode 135 and the frames 150 and 150' formed in the bottom electrode 115 of the acoustic resonators 100B through 100F, respectively, although the functionality of the frames 245, 250 and 250' is substantially the same as discussed above. In particular, the top electrode 235 in FIGS. 2A, 2C and 2D is a composite electrode comprising two different metal materials to provide integrated lateral features (frames 245). Likewise, the bottom electrodes 215, 215' in FIGS. 2B, 2C and 2D are also composite electrodes comprising two different metal materials to provide integrated lateral features (frames 250, 250').

Generally, the frame 245 comprises an inside electrode layer formed on the piezoelectric layer 125 and an outside electrode layer formed on the inside electrode layer. The outside electrode layer is formed of a first material and the inside electrode layer is formed of the first material and a second material, where the first material effectively extends from the outside electrode layer through the second material of the inside electrode layer to provide the frame 245 (in a bottom portion of the top electrode 235). The second material may have higher (lower) sound velocity than the first material in order to form a low (high) velocity frame. For example, for low velocity frame the second material may be formed of molybdenum (Mo) or aluminum (Al) and the first material may be tungsten (W), although other materials may be incorporated without departing from the scope of the present teachings. The frame 250 comprises an inside electrode layer formed beneath the piezoelectric layer 125 and an outside electrode layer formed beneath the inside electrode layer. The inside electrode layer is formed of the first material and the outside electrode layer is formed of the first and second materials, where the first material effectively extends from the inside electrode layer through the second material of the outside electrode layer to provide the frame 250 (in a bottom portion of the bottom electrode 215). Similarly, the frame 250' comprises an inside electrode layer formed beneath the piezoelectric layer 125 and an outside electrode layer formed beneath the inside electrode layer. The outside electrode layer is formed of the first material and the inside electrode layer is formed of the first and second materials, where the first material effectively extends from the outside electrode layer through the second material of the inside electrode layer to provide the frame 250' (in a top portion of the bottom electrode 215').

The frames may be realized by other types and locations of integrated lateral features formed by composite electrodes, without departing from the scope of the present teachings. Examples of composite electrodes with integrated lateral features are provided by U.S. patent application Ser. No. 13/660,941, filed Oct. 25, 2012, which is hereby incorporated by reference in its entirety. Also, some general tradeoffs of different frame configurations are described, for instance, in the above cited U.S. patent application Ser. No. 13/663,449. Of course, the structures of the frames 245, 250 and 250' may be applied to the acoustic resonators 100B through 100E, discussed above, and the structures of the frames 145, 150 and 150' may be applied to the acoustic resonators 200A through 200D, without departing from the scope of the present teachings.

In alternative embodiments, the various features of the acoustic resonators 100B through 200D may be provided in various combinations that include either a collar (of various types or locations) or one or more frames (of various types or locations), but not both collars and frames, without departing from the scope of the present teachings. For example, FIGS. 3A through 3D are cross-sectional views of acoustic resonators 300A through 300D, respectively, according to other representative embodiments, which include collars or frames, along with other illustrative features discussed above.

Figure 3A:
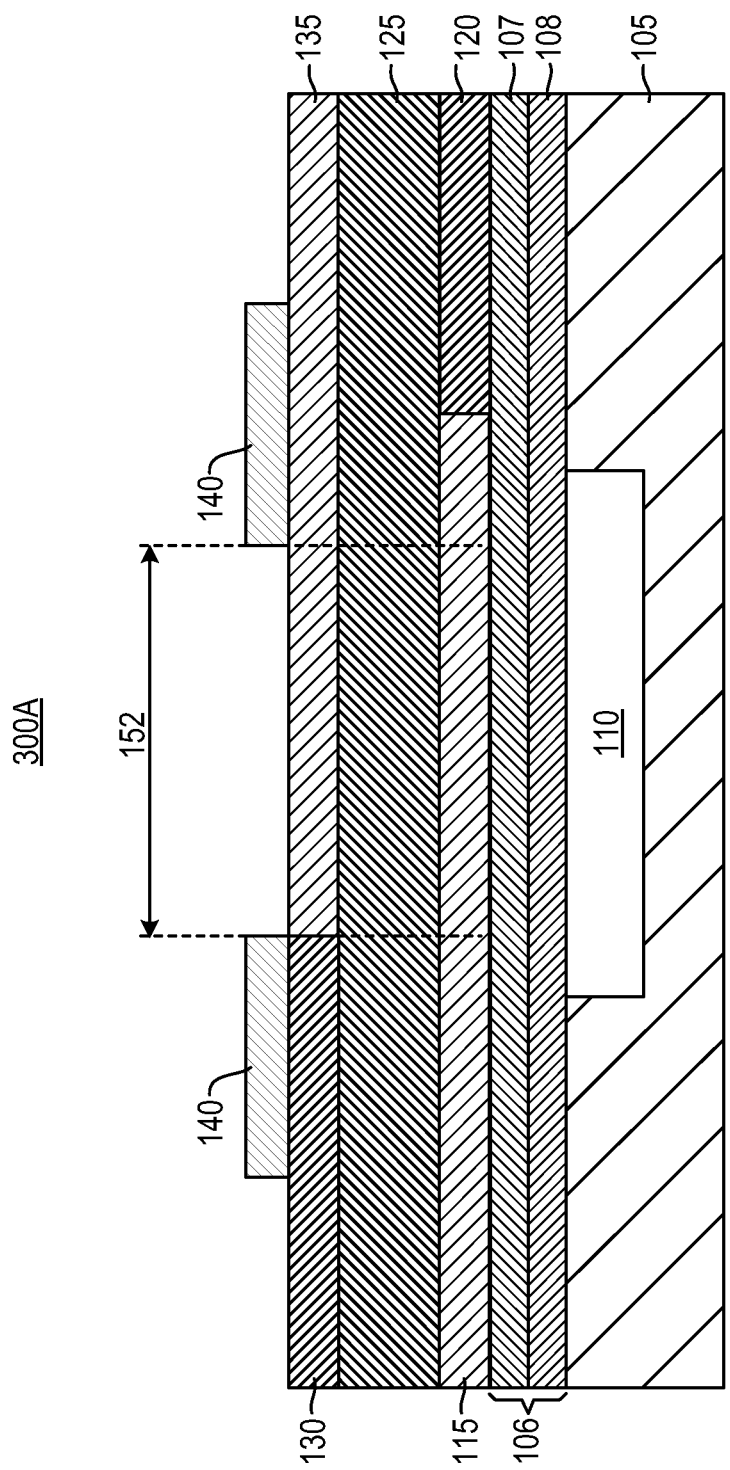
FIG. 3A is a cross-sectional view of an acoustic resonator, excluding frames, according to another representative embodiment.
Figure 3B:
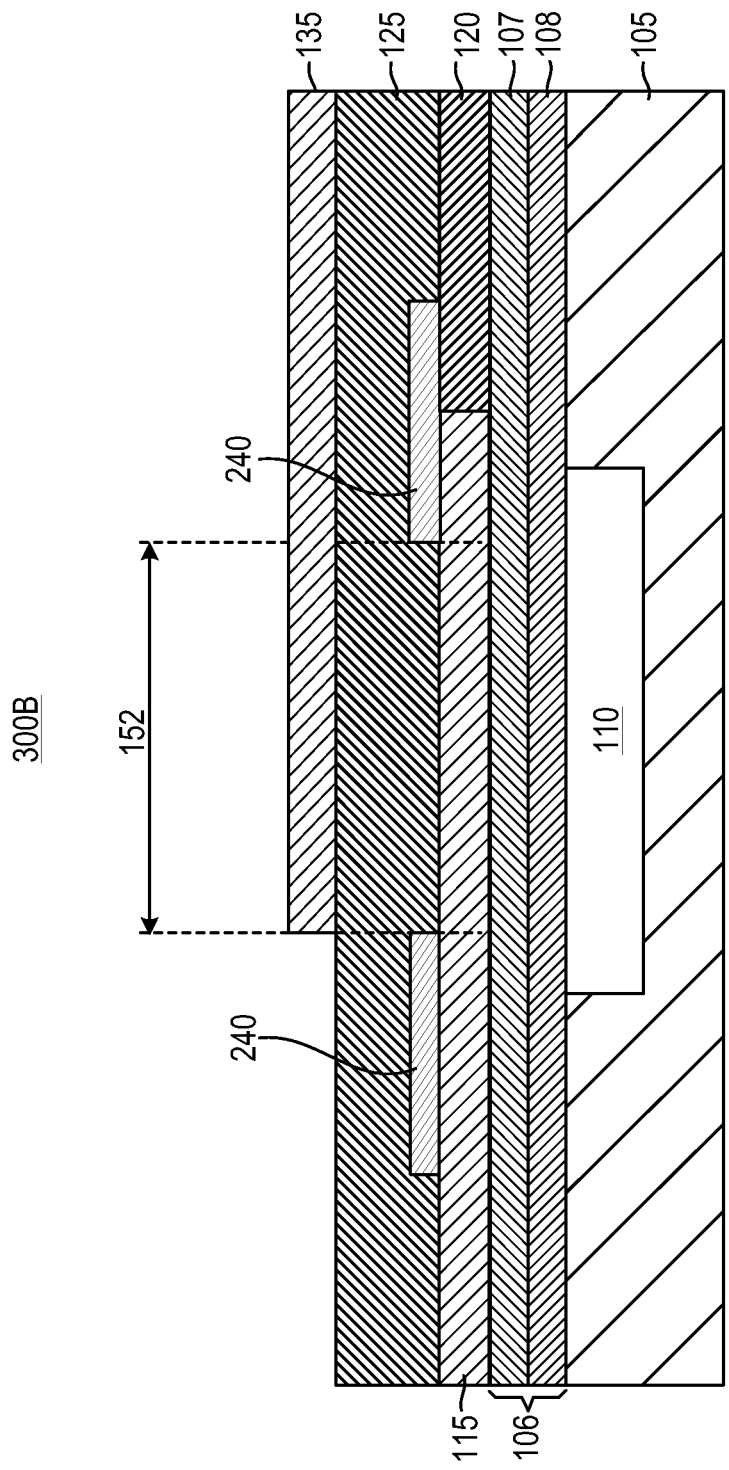
FIG. 3B is a cross-sectional view of an acoustic resonator, excluding frames, according to another representative embodiment.
Figure 3C:
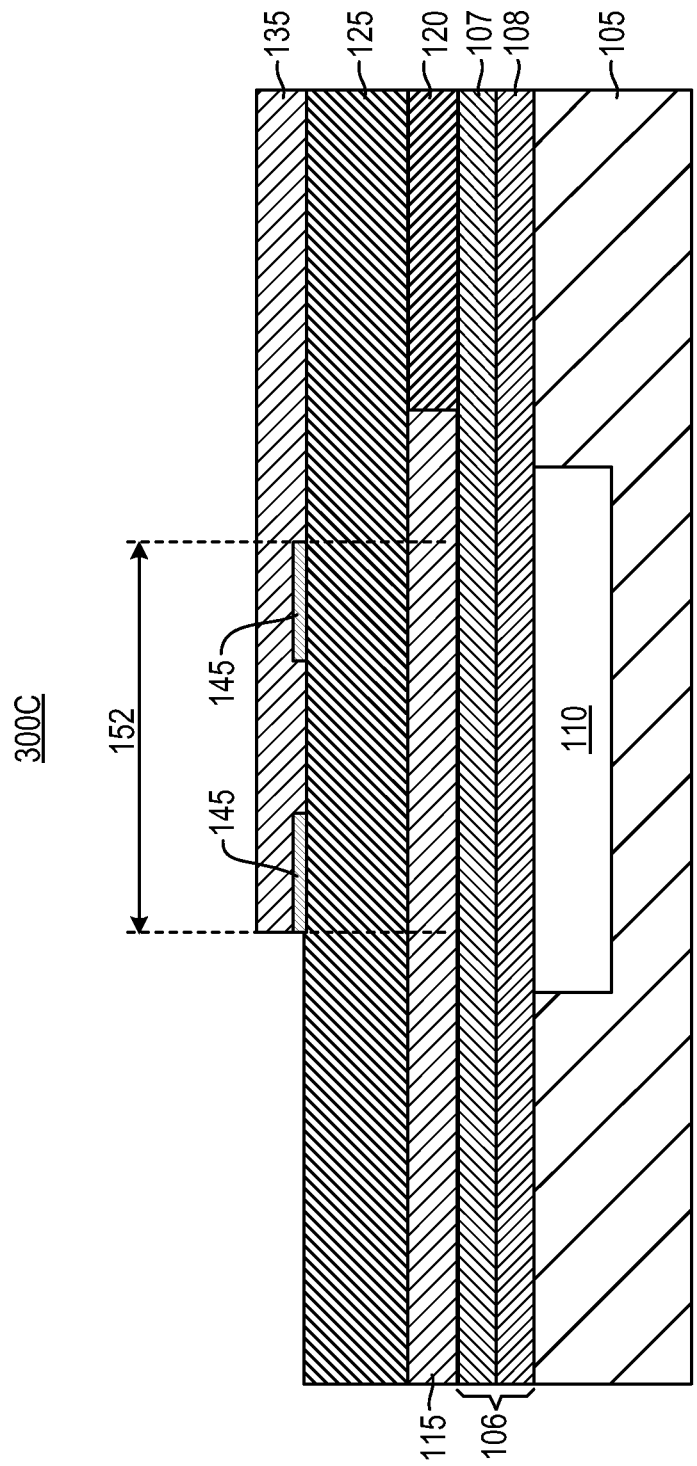
FIG. 3C is a cross-sectional view of an acoustic resonator, excluding collars, according to another representative embodiment.
Figure 3D:
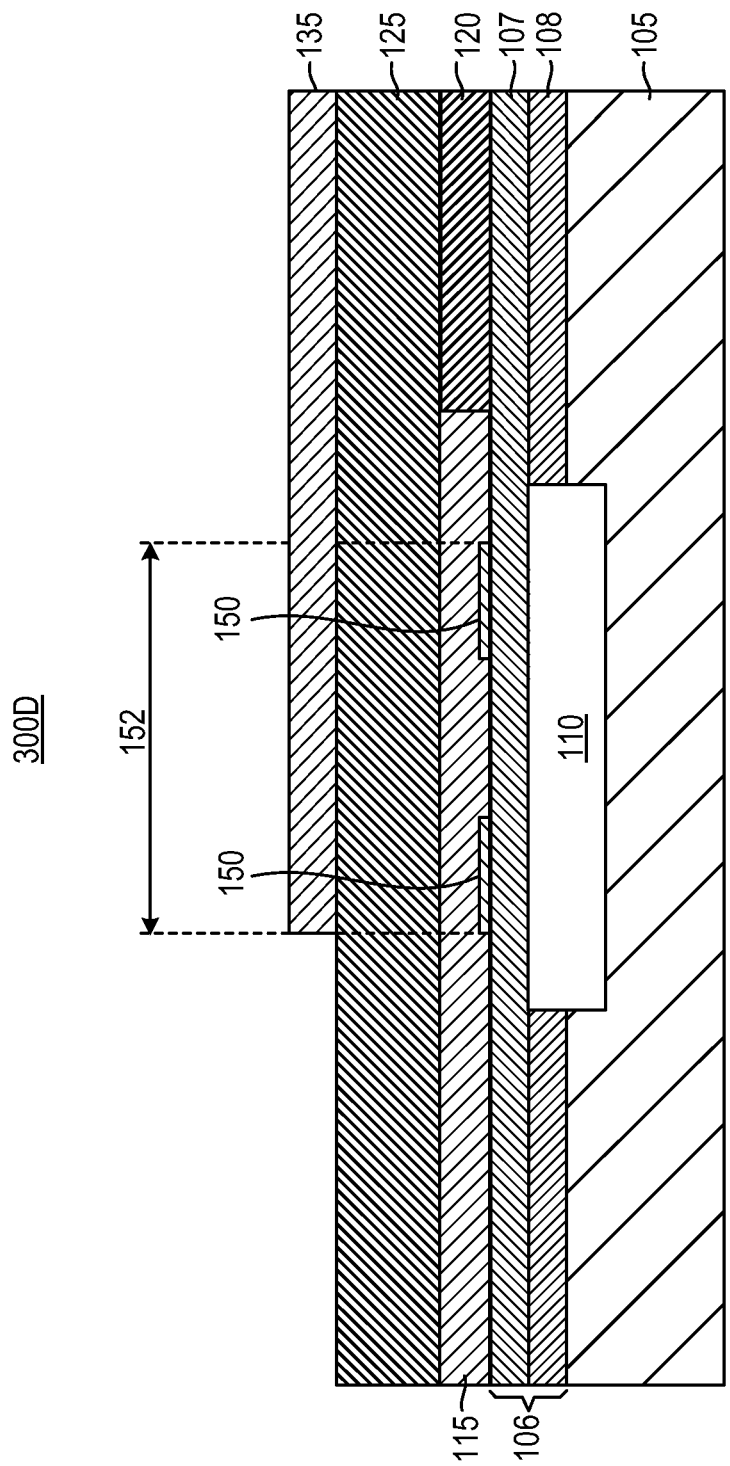
FIG. 3D is a cross-sectional view of an acoustic resonator, excluding collars, according to another representative embodiment.

Referring to FIG. 3A, the acoustic resonator 300A is a representative FBAR that is similar to acoustic resonator 100B, except that it includes only the collar 140 in addition to the DBR 106 with temperature compensating first acoustic impedance layer 107 (with no frame). Similarly, referring to FIG. 3B, the acoustic resonator 300B is a representative FBAR that is similar to acoustic resonator 200A, except that it includes only the collar 240 in addition to the DBR 106 with temperature compensating first acoustic impedance layer 107 (with no frame). Referring to FIG. 3C, the acoustic resonator 300C is a representative FBAR that is similar to acoustic resonator 100B, except that it includes only the frame 145 in addition to the DBR 106 with temperature compensating first acoustic impedance layer 107 (with no collar). Similarly, referring to FIG. 3D, the acoustic resonator 300D is a representative FBAR that is similar to acoustic resonator 100D, except that it includes only the frame 150 in addition to the DBR 106 with temperature compensating first acoustic impedance layer 107 (with no collar). Additional examples similar to acoustic resonators 300C and 300D are described in U.S. patent application Ser. No. 13/767,754 to Burak et al., mentioned above, which is hereby incorporated by reference in its entirety.

Of course, these are only examples of features. Other features and other combinations of features may be incorporated without departing from the scope of the present teachings. For example, the acoustic resonators 300C and/or 300D alternatively may include only frame 150', both frames 145 and 150, or both frames 145 and 150'. Also, various different arrangements and/or types of frames (e.g., frames 145, 150, 150', 245, 250, 250') (composite or add-on) and collars (e.g., collars 140, 240), as discussed above, may be incorporated, without departing from the scope of the present teachings. The DBRs and corresponding temperature compensating features, the frames, and the collars provide benefits similar to those discussed above, although performance and manufacture varies somewhat due to different locations and combinations.

FIG. 4 is a graph illustrating the quality factor (Q-factor) and parallel resistance Rp of the acoustic resonators of FIGS. 3A and 1B, as compared to an acoustic resonator having only an acoustic reflector (e.g., DBR 106) with a temperature compensating acoustic impedance layer (e.g., first acoustic impedance layer 107 formed of material having a positive temperature coefficient). That is, FIG. 4 illustrates simulated Q-factor and parallel resistance Rp comparisons of acoustic resonators with a temperature compensating acoustic impedance layer in an acoustic mirror (e.g., temperature compensating first acoustic impedance layer 107), with and without a collar (e.g., collar 140), and with and without a collar and an integrated frame (e.g., frame 145), as are shown in FIGS. 3A and 1B, for example. The purpose of theses graphs is to illustrate changes in performance of the pass-band of the acoustic resonators that occur as a consequence of adding the collar 140 and the frame 145 to the acoustic reflector with a temperature compensating acoustic impedance layer. Referring to FIG. 4, Q-factor is represented by a y-axis on the left side, and Rp is represented by a y-axis on the right side. The values of the Q-factor and Rp are shown as functions of input signal frequencies on an x-axis.

In the example of FIG. 4, the dimensions of the acoustic resonator (e.g., acoustic resonator 100B) have been tuned for high Rp. In particular, bottom electrode 115 is formed of Mo with a thickness of approximately 3800 Å, piezoelectric layer 125 is formed of AlN with a thickness of approximately 9300 Å, top electrode 135 is formed of Mo with a thickness of approximately 3250 Å, and a passivation layer is formed of AlN (over the top electrode 135) with a thickness of approximately 2000 Å. With regard to alignments, an outer edge of the bottom electrode 115 extends approximately 5.5 µm outside the cavity 110, and an outer edge of the top electrode 135 extends approximately 5.0 µm within the cavity 110.

Further, in the example, the DBR 106 includes first acoustic impedance layer 107 formed of tetra-ethyl-orthosilicate (TEOS), with a thickness of approximately 7500 Å, and second acoustic impedance layer 108 formed of W with a thickness of approximately 4500 Å, optimized for best parallel resistance Rp for the particular scenarios, discussed below. Thus, the first acoustic impedance layer 107 may operate at a series resonance frequency of about 2.7 GHz and the second acoustic impedance layer 108 may operate at a series resonance frequency of about 2.9 GHz. With regard to collars and frames (when included), the collar 140 is formed of SiC at a thickness of approximately 9500 Å (i.e., about 4250 Å thicker than the top electrode 135 and the passivation layer) and a width of approximately 11.5 µm, and the frame 145 is a composite frame formed of approximately 350 Å thick and approximately 3.75 µm wide Al embedded in the Mo at the bottom of the top electrode 135.

FIG. 4 depicts three configurations, each of which is indicated by a corresponding Q-factor curve and Rp value curve. In particular, curves 410Q and 410R respectively illustrate the Q-factors and the Rp values of a bare resonator (FBAR) with the temperature compensating DBR 106 having temperature compensating first acoustic impedance layer 107. This design generally corresponds to acoustic resonator 300A shown in FIG. 3A, but without the collar 140. Similarly, curves 420Q and 420R respectively illustrate the Q-factors and the Rp values of the acoustic resonator with the temperature compensating DBR 106 and the collar 140 (e.g., acoustic resonator 300A), and curves 430Q and 430R respectively illustrate the Q-factors and the Rp values of the acoustic resonator with the temperature compensating DBR 106, the collar 140, and the frame 145 (e.g., acoustic resonator 100B). More specifically, curves 410R, 420R and 430R illustrate magnitudes of complex-valued electrical impedance of the acoustic resonator.

At parallel resonance frequency Fp electrical impedance becomes approximately real-valued and the peak value of electrical impedance magnitude indicates parallel resistance Rp. A peak value of the Q-factor occurs for each of the curves 410Q through 430Q at about 1.925 GHz. This frequency corresponds to the series resonance frequency Fs of the respective acoustic resonators. Similarly, peak values of Rp occur for each of the curves 410R through 430R in a range of about 1.962 GHz to about 1.966 GHz. These frequencies correspond to the parallel resonance frequency Fp of the respective acoustic resonators. The bandwidths of these acoustic resonators correspond to the range of frequencies between their respective values of series resonance frequency Fs and parallel resonance frequency Fp.

Referring to FIG. 4, it is apparent that including the combination of all features (temperature compensating DBR 106, collar 140 and frame 145) in the acoustic resonator improves performance of the acoustic resonator. For example, adding the collar 140 (curves 420Q and 420R) increases parallel resistance Rp by about five times. Further adding the frame 145 (curves 430Q and 430R) increases the parallel resistance Rp about another two times (about a ten times increase in parallel resistance Rp overall). In particular, curve 410R (temperature compensating DBR 106 only) indicates an Rp value of about 570 Ohms, curve 420R indicates an Rp value of about 2700 Ohms and curve 430R indicates an Rp value of about 5700 Ohms. Also, at frequencies above the series resonance frequency Fs, the acoustic resonator has significantly higher Q-factor, indicated by curves 420Q and 430Q in comparison to curve 410Q. As should be appreciated by one of ordinary skill in the art, the Q-factor and Rp values of the acoustic resonator increase without significant degradation of the bandwidth when compared to the acoustic resonator with only temperature compensating DBR 106.

Notably, by adding the collar 140 and the frame 145, radiative loss is substantially eliminated, essentially flattening the Q-factor values at and above the series resonance frequency Fs, as indicated by curve 430Q. Increased series Q-factor Qs (decreased series resistance Rs) is due to lowered scattering at the series resonance frequency Fs. However, for frequencies below the series resonance frequency Fs, the Q-factor curve 410Q for a bare resonator with a temperature compensating DBR 106 becomes very irregular with distinct peaks and valleys between neighboring frequencies. This irregular spectral pattern, or so-called "rattles," is caused by excitation of a propagating thickness extensional mode pTE1-, e.g., at the edge of the top electrode 135 for driving frequencies below series resonance frequency Fs (by analogous mechanism described above in relation to excitation of eTE1 mode for driving frequencies above the series resonance frequency Fs). As should be appreciated by one skilled in the art, for so-called type-II acoustic stacks (as considered in the present teaching), the evanescent eTE1 mode above series resonance frequency Fs corresponds to propagating pTE1-mode below series resonance frequency Fs. A phase of acoustically excited pTE1-mode may change very rapidly as the driving frequency changes, which in turn may produce a rattle in the Q-factor spectrum, as seen in curve 410Q, for example.

The presence of the collar 140 in acoustic resonator 300A allows the piston mode in the main membrane region to couple predominantly to eTE1 mode in the collar region of the collar 140 rather than to pTE1-mode of main membrane region, provided that the designed collar's cutoff frequency is slightly below the driving frequency. As a result, rattles below series resonance frequency Fs are suppressed, as indicated by circle 425 for curve 420Q. Such simultaneous suppression of rattles below series resonance frequency Fs and increase of Q-factor above series resonance frequency Fs is generally very beneficial for filter performance, for example. As mentioned above, addition of a low velocity composite frame 145 as in the acoustic resonator 100B, for example, enables an increase in parallel resistance Rp by approximately three times as compared to the acoustic resonator 300A without the frame. The increase of parallel resistance Rp is however accompanied by increased rattles in the acoustic resonator 100B at frequencies below the series resonance frequency Fs, as indicated by circle 435 for curve 430Q. The increase of rattles' amplitude is caused by the fact that in the low velocity frame region of the frame 145, the piston mode is driven in opposite phase to the piston mode in the main membrane region 152, causing enhanced pTE1-mode excitation at the main region/frame region interface. Thus, numerical and experimental optimization of the respective widths and thicknesses of the frame 145 and collar 140 may be performed to simultaneously decrease rattles below series resonance frequency Fs and increase Q-factor and parallel resistance Rp above resonance frequency Fs to the desired level.

In the above-described embodiments, DBRs and corresponding temperature compensating features, collars and frames can generally be formed using conventional processing techniques, with examples including various forms of deposition, sputtering, etching, polishing, and so on. Moreover, the described embodiments and related methods of fabrication can be modified in various ways as will be apparent to those skilled in the art.

In accordance with various embodiments, a low acoustic impedance layer functioning as a temperature compensating layer in a DBR formed over a cavity, combined with one or more frames and/or collars, create weakly confined structures that minimize parasitic scattering of electrically excited piston mode, and therefore create acoustically lossless acoustic resonator, such as an FBAR or SMR. Generally, the collar couples piston mode and eTE1 mode of the main membrane region to evanescent mode of the collar region, the DBR effectively eliminates dead-FBAR and minimizes coupling of the eTE1 mode of the collar to the resonator substrate while providing at least partial temperature compensation of the frequency response, and the frame (e.g., composite frame) suppresses excitation of propagating modes.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator, comprising:
   an acoustic reflector disposed on a substrate over a cavity formed in the substrate, the acoustic reflector comprising a layer of low acoustic impedance material stacked on a layer of high acoustic impedance material;
   a bottom electrode disposed on the layer of low acoustic impedance material of the acoustic reflector;
   a piezoelectric layer disposed on the bottom electrode;
   a top electrode disposed on the piezoelectric layer; and
   a collar formed outside a main membrane region defined by an overlap between the top electrode, the piezoelectric layer and the bottom electrode, the collar having an inner edge substantially aligned with a boundary of or overlapping the main membrane region,
   wherein the layer of the low acoustic impedance material comprises a temperature compensating material having a positive temperature coefficient for offsetting at least a portion of a negative temperature coefficient of the piezoelectric layer, the bottom electrode and the top electrode.

2. The acoustic resonator of claim 1, wherein the low acoustic impedance material comprises borosilicate glass (BSG) or tetra-ethyl-ortho-silicate (TEOS).

3. The acoustic resonator of claim 1, wherein the collar defines a collar region having a cutoff frequency that is substantially the same as a cutoff frequency of the main membrane region.

4. The acoustic resonator of claim 3, wherein the collar is formed on a top surface of the top electrode and a planarization layer adjacent the top electrode.

5. An acoustic resonator, comprising:
   an acoustic reflector disposed over a cavity formed in a substrate, the acoustic reflector comprising a layer of low acoustic impedance material stacked on a layer of high acoustic impedance material;

a bottom electrode disposed on the layer of low acoustic impedance material of the acoustic reflector;
a piezoelectric layer disposed on the bottom electrode;
a top electrode disposed on the piezoelectric layer; and
a collar formed outside a main membrane region defined by an overlap between the top electrode, the piezoelectric layer and the bottom electrode, the collar having an inner edge substantially aligned with a boundary of or overlapping the main membrane region,
wherein the layer of the low acoustic impedance material comprises a temperature compensating material having a positive temperature coefficient for offsetting at least a portion of a negative temperature coefficient of the piezoelectric layer, the bottom electrode and the top electrode, and
wherein the collar is formed between the bottom electrode and the piezoelectric layer.

6. The acoustic resonator of claim 1, further comprising:
at least one frame disposed within the main membrane region and having an outer edge substantially aligned with the boundary of the main membrane region.

7. The acoustic resonator of claim 6, wherein the at least one frame comprises an add-on frame.

8. The acoustic resonator of claim 6, wherein the at least one frame comprises a composite frame.

9. The acoustic resonator of claim 6, wherein the at least one frame comprises a frame disposed at a bottom portion of the top electrode.

10. The acoustic resonator of claim 9, wherein the at least one frame comprises another frame disposed at one of a top portion or a bottom portion of the bottom electrode.

11. The acoustic resonator of claim 6, wherein the at least one frame comprises a frame disposed at a bottom portion of the bottom electrode.

12. The acoustic resonator of claim 1, wherein the collar comprises borosilicate glass, carbon-doped silicon oxide, silicon carbide, silicon nitride, aluminum oxide, aluminum nitride, zinc oxide, lead zirconium titanate, diamond or diamond-like carbon.

13. The acoustic resonator of claim 6, wherein the frame comprises a layer of copper, molybdenum, aluminum, tungsten, iridium, borosilicate glass, carbon-doped silicon oxide, silicon carbide, silicon nitride, aluminum oxide, aluminum nitride, zinc oxide, lead zirconium titanate, diamond or diamond-like carbon.

14. The acoustic resonator of claim 1, wherein the piezoelectric layer is doped with at least one rare earth element for offsetting at least a portion of degradation of an electromechanical coupling coefficient of the acoustic resonator caused by the temperature compensating material.

15. A thin-film bulk acoustic resonator (FBAR), comprising:
a substrate defining a cavity;
a distributed Bragg reflector (DBR) disposed on a top surface of the substrate over the cavity, the DBR comprising at least one layer of low acoustic impedance material having a positive temperature coefficient;
an acoustic stack arranged on the DBR over the cavity, the acoustic stack comprising a piezoelectric layer sandwiched between bottom and top electrode layers, and having a main membrane region defined by an overlap between the bottom electrode, the piezoelectric layer, and the top electrode; and
a collar arranged outside the main membrane region, the collar defining a collar region having a cutoff frequency that is substantially the same as a cutoff frequency of the main membrane region,
wherein the positive temperature coefficient of the at least one layer of low acoustic impedance material offsets at least a portion of a negative temperature coefficient of the piezoelectric layer, the bottom electrode layer and the top electrode layer.

16. The FBAR of claim 15, further comprising:
a frame formed in or on at least one of the bottom and top electrodes, and disposed within the main membrane region.

17. The FBAR of claim 16, wherein the collar is formed on a surface of the bottom electrode.

18. The FBAR of claim 16, wherein the collar is formed on a surface of the top electrode and a planarization layer adjacent to the top electrode.

19. The acoustic resonator of claim 1, wherein the piezoelectric layer is doped with at least one rare earth element for offsetting at least a portion of degradation of an electromechanical coupling coefficient of the acoustic resonator caused by the low acoustic impedance material having the positive temperature coefficient.

20. The acoustic resonator of claim 5, wherein the collar defines a collar region having a cutoff frequency that is substantially the same as a cutoff frequency of the main membrane region.

* * * * *